(12) United States Patent
Kobayashi et al.

(10) Patent No.: US 7,002,507 B2
(45) Date of Patent: Feb. 21, 2006

(54) PIPELINED AND CYCLIC ANALOG-TO-DIGITAL CONVERTERS

(75) Inventors: Shigeto Kobayashi, Anpachi-Gun (JP); Kuniyuki Tani, Ogaki (JP); Atsushi Wada, Ogaki (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/945,880

(22) Filed: Sep. 22, 2004

(65) Prior Publication Data

US 2005/0068218 A1    Mar. 31, 2005

(30) Foreign Application Priority Data

Sep. 25, 2003 (JP) ............................. 2003-334450
Feb. 19, 2004 (JP) ............................. 2004-043246

(51) Int. Cl.
*H03M 1/14* (2006.01)
*H03M 1/40* (2006.01)

(52) U.S. Cl. .................... 341/162; 341/163; 341/156

(58) Field of Classification Search ................ 341/156, 341/161, 162, 163
See application file for complete search history.

(56) References Cited

U.S. PATENT DOCUMENTS

| 5,105,194 | A  | * | 4/1992 | Mizunoue ................... 341/156 |
| 5,644,313 | A  | * | 7/1997 | Rakers et al. ............... 341/163 |
| 6,195,032 | B1 | * | 2/2001 | Watson et al. .............. 341/162 |
| 2005/0024250 | A1 | * | 2/2005 | Atriss et al. ................. 341/163 |
| 2005/0068221 | A1 | * | 3/2005 | Freeman et al. ............ 341/161 |

FOREIGN PATENT DOCUMENTS

| JP | 4-026229 | 1/1992 |
| JP | 11-145830 | 9/1999 |

* cited by examiner

*Primary Examiner*—Howard L. Williams
(74) *Attorney, Agent, or Firm*—McDermott Will & Emery LLP

(57) ABSTRACT

A need exists to provide an AD converter which is well balanced between an increase in processing speed and a decrease in circuit area. The AD converter performs an analog-to-digital conversion separately in four steps, while performing pipelined processing on an AD conversion of the first stage by a first AD conversion circuit and AD conversions of the second to fourth steps by a second AD conversion circuit. A DA conversion circuit, a subtractor circuit, and an amplifier circuit are utilized in a DA conversion, subtraction, and amplification in the first step as well as in DA conversions, subtractions, and amplifications in the second to fourth steps, thus shared in all the steps.

31 Claims, 13 Drawing Sheets

150

PIPELINED AND CYCLIC ANALOG-TO-DIGITAL CONVERTERS

BACKGROUND OF THE INVENTION

1. Field of the Invention

The present invention relates to an analog-to-digital converter, and more particularly, to multistage pipelined and cyclic analog-to-digital conversion technologies.

2. Description of the Related Art

Recently, cellular phones, which have been provided with various additional functions such as an image capturing function, an image reproducing function, a moving image capturing function, and a moving image reproducing function, increasingly require further reduction in size and power consumption of an analog-to-digital converter (hereinafter referred to as "AD converters") incorporated therein. One of the forms of such AD converters known to those skilled in the art is a cyclic AD converter having a cyclic configuration (e.g., see Japanese Patent Laid-Open Publication No. Hei 11-145830). FIG. 9 shows the configuration of a conventional cyclic AD converter. In the cyclic AD converter 150 of FIG. 9, an analog signal Vin input through a first switch 152 is sampled by a first amplifier circuit 156 and then converted into a digital value of one bit in an AD conversion circuit 158. The digital value is then converted into an analog value by a DA conversion circuit 160 and subtracted from the input analog signal Vin by a subtractor circuit 162. The output from the subtractor circuit 162 is amplified by a second amplifier circuit 164 for feedback to the first amplifier circuit 156 through a second switch 154. This feedback-based cyclic processing is repeated twelve times to obtain a digital value of 12 bits.

On the other hand, another AD converter is disclosed in Japanese Patent Laid-Open Publication No. Hei 4-26229 (its entirety and FIG. 1), which has two stages including a cyclic conversion portion.

(First Problem)

The cyclic AD converter described in Japanese Patent Laid-Open Publication No. Hei 11-145830 has an advantage over a multistage pipelined AD converter in having a reduced number of constituent elements and thereby a reduced circuit area. However, since the cyclic AD converter may suffer from a reduced conversion speed whereas achieving a reduced circuit area, an efficient configuration has to be implemented for the cyclic AD converter to improve both of these mutually contradictory performances.

(Second Problem)

The cyclic AD conversion portion described in Japanese Patent Laid-Open Publication No. Hei 4-26229 shares the AD conversion circuit, the DA conversion circuit, the subtractor circuit, and the amplifier circuit, thus contributing a reduction in circuit area. However, although the sharing requires higher-speed operations of each circuit, the amplifier circuit, among other things, has a GB (Gain Bandwidth) product limitation, thereby making it difficult to achieve both a high amplification factor and a high-speed operation at the same time. On the other hand, a conventional pipelined configuration of multiple stages is also available as a method which does not require a high-speed operation of individual circuits; however, this configuration results in an increased circuit area. That is, the conventional configuration was particularly difficult to provide both a reduced size and a high-speed operation at the same time. Among other things, the amplifier circuit having a high amplification factor impedes the high-speed operation.

SUMMARY OF THE INVENTION

The present invention was developed in view of these problems. It is therefore an object of the present invention to provide an AD converter which is well balanced between an increase in processing speed and a decrease in circuit area.

(First Means)

An aspect according to first means of the present invention provides an analog-to-digital converter. This analog-to-digital converter comprises: a plurality of AD conversion circuits which converts an input analog signal into a digital value of a predetermined number of bits; one or more DA conversion circuits, less in number than the plurality of AD conversion circuits, which converts the output of the plurality of AD conversion circuits into an analog signal; a subtractor circuit which subtracts the output of the one or more DA conversion circuits from the input analog signal; and an amplifier circuit which amplifies the output of the subtractor circuit for feedback to at least any one of the plurality of AD conversion circuits. At least any one of the plurality of AD conversion circuits and at least any one of the one or more DA conversion circuits are repeatedly utilized for feedback-based cyclic processing.

According to this aspect, the analog-to-digital converter can have an increased number of AD conversion circuits as compared with the conventional cyclic AD converter to improve the processing speed, while the DA conversion circuits less in number than the AD conversion circuits are shared in multiple steps of AD conversion. This provides an improved speed while preventing an increase in circuit area.

Another aspect of the present invention also provides an analog-to-digital converter. This analog-to-digital converter comprises: a first AD conversion circuit which converts an input analog signal into a digital value of a predetermined number of bits; a DA conversion circuit which converts the output of the first AD conversion circuit into an analog signal; a subtractor circuit which subtracts the output of the DA conversion circuit from the input analog signal; an amplifier circuit which amplifies the output of the subtractor circuit for feedback; and a second AD conversion circuit which converts the output of the amplifier circuit into a digital value of a predetermined number of bits after the feedback. The DA conversion circuit converts the output of the second AD conversion circuit into an analog signal after the feedback.

To improve the processing speed by increasing the number of AD conversion circuits as compared with the conventional cyclic AD converter, the DA conversion circuit, the subtractor circuit, and the amplifier circuit can be shared in AD conversions after the feedback without increasing the number thereof. This provides an improved speed while preventing an increase in circuit area.

A still another aspect of the present invention also provides an analog-to-digital converter which performs an analog-to-digital conversion separately in multiple steps. This analog-to-digital converter comprises: an AD conversion circuit which converts an input analog signal into a digital value of a predetermined number of bits in at least any one of the multiple steps; a DA conversion circuit which converts the output of the AD conversion circuit into an analog signal; a subtractor circuit which subtracts the output of the DA conversion circuit from the input analog signal; and an amplifier circuit which amplifies the output of the subtractor circuit for feedback. The amplifier circuit is also utilized for other processing in the final step of the multiple steps.

An analog-to-digital conversion being performed separately in multiple steps as in the conventional cyclic AD converter will eliminate the need of subtracting the digital value of the least significant bit output by the AD conversion circuit in the final step from the original analog value and thus the need of amplifying the otherwise subtracted value. In this context, this aspect makes it possible to utilize the amplifier circuit for other processing than amplifying the output of the subtractor circuit for feedback, thereby making effective use of the amplifier circuit without an increase in circuit area of the entire device including the analog-to-digital converter.

A still further aspect of the present invention also provides an analog-to-digital converter which performs an analog-to-digital conversion separately in multiple steps. This analog-to-digital converter comprises: an AD conversion circuit which converts an input analog signal into a digital value of a predetermined number of bits in at least any one of the multiple steps; a DA conversion circuit which converts the output of the AD conversion circuit into an analog signal; a subtractor circuit which subtracts the output of the DA conversion circuit from the input analog signal; and an amplifier circuit which amplifies the output of the subtractor circuit for feedback. The subtractor circuit is also utilized for other processing in the final step of the multiple steps.

An analog-to-digital conversion being performed separately in multiple steps as in the conventional cyclic AD converter will eliminate the need of subtracting the digital value of the least significant bit output by the AD conversion circuit in the final step from the original analog value. In this context, this aspect makes it possible to utilize the subtractor circuit not in the fourth step but in the first step for simultaneous processing, thereby making effective use of the subtractor circuit by improving the processing speed without an increase in circuit area of the entire device including the analog-to-digital converter.

A still another aspect of the present invention also provides an analog-to-digital converter which performs an analog-to-digital conversion separately in multiple steps. This analog-to-digital converter comprises: an AD conversion circuit which converts an input analog signal into a digital value of a predetermined number of bits in at least any one of the multiple steps; a DA conversion circuit which converts the output of the AD conversion circuit into an analog signal; a subtractor circuit which subtracts the output of the DA conversion circuit from the input analog signal; and an amplifier circuit which amplifies the output from the subtractor circuit for feedback. The DA conversion circuit is also utilized for other processing in the final step of the multiple steps.

An analog-to-digital conversion being performed separately in multiple steps as in the conventional cyclic AD converter will eliminate the need of converting the digital value of the least significant bit output by the AD conversion circuit in the final step into an analog value. In this context, this aspect makes it possible to utilize the DA conversion circuit not in the fourth step but in the first step for simultaneous processing, thereby making effective use of the DA conversion circuit by improving the processing speed without an increase in circuit area of the entire device including the analog-to-digital converter.

(Second Means)

An aspect according to second means of the present invention provides an analog-to-digital converter which has at least two or more stages. In this analog-to-digital converter, one of stages comprises a common subtractor circuit which selectively subtracts a signal obtained by converting a converted digital value of the self-stage into an analog value from an input analog signal of the self-stage or subtracts a signal obtained by converting a converted digital value of another stage into an analog value from an input analog signal of the another stage, and a common amplifier circuit which amplifies the output of the common subtractor circuit with a predetermined amplification factor.

This aspect allows one and another stages to share the subtractor circuit and the amplifier circuit, thereby providing a reduced circuit area. This aspect also makes it possible to switch alternately between signals from the self-stage and another stage with a predetermined timing for input to the subtractor circuit, thereby implementing a reduced circuit area without impairing the conversion speed.

Another aspect according to the present invention also provides an analog-to-digital converter which has at least two or more stages. This analog-to-digital converter comprises: a first AD conversion circuit which converts an input analog signal of a first stage into a digital value of a predetermined number of bits; a first DA conversion circuit which converts the output of the first AD conversion circuit into an analog signal; a second AD conversion circuit which converts an input analog signal of a second stage subsequent to the first stage into a digital value of a predetermined number of bits; a second DA conversion circuit which converts the output of the second AD conversion circuit into an analog signal; a common subtractor circuit which selectively subtracts the output signal of the first DA conversion circuit from the input analog signal of the first stage or subtracts the output signal of the second DA conversion circuit from the input analog signal of the second stage; a common amplifier circuit which amplifies the output of the common subtractor circuit with a predetermined amplification factor; a first stage switch which turns on or off the delivery of the input analog signal of the first stage and the delivery of the output signal of the first DA conversion circuit to the common subtractor circuit; and a second stage switch which turns on or off the delivery of the input analog signal of the second stage and the delivery of the output signal of the second DA conversion circuit to the common subtractor circuit.

This aspect allows the first and second stages to share the subtractor circuit and the amplifier circuit, thereby providing a reduced circuit area. This aspect also makes it possible to alternate between the first stage and the second stage switches with a predetermined timing to supply a signal to the subtractor circuit, thereby implementing a reduced circuit area without impairing the conversion speed.

Another aspect according to the present invention also provides an analog-to-digital converter which has at least two or more stages. In this analog-to-digital converter, one of the stages comprises a common DA conversion circuit which selectively converts a converted digital value of the self-stage or another stage into an analog signal; a common subtractor circuit which selectively subtracts the output signal of the common DA conversion circuit obtained by converting the converted digital value of the self-stage from an input analog signal of the self-stage or subtracts the output signal of the common DA conversion circuit obtained by converting the converted digital value of the another stage from an input analog signal of the another stage; and a common amplifier circuit which amplifies the output from the common subtractor circuit with a predetermined amplification factor.

This aspect allows one and another stages to share the subtractor circuit, the amplifier circuit, and the DA conversion circuit, thereby providing a reduced circuit area. This aspect also makes it possible to switch alternately between signals from the self-stage and another stage with a predetermined timing for input to the DA conversion circuit and the subtractor circuit, thereby implementing a reduced circuit area without impairing the conversion speed.

Another aspect according to the present invention also provides an analog-to-digital converter which has at least two or more stages. This analog-to-digital converter comprises: a first AD conversion circuit which converts an input analog signal of a first stage into a digital value of a predetermined number of bits; a second AD conversion circuit for converting an input analog signal of a second stage subsequent to the first stage into a digital value of a predetermined number of bits; a common DA conversion circuit which selectively converts the output of the first AD conversion circuit or the output of the second AD conversion circuit into an analog signal; a common subtractor circuit which selectively subtracts the output signal of the common DA conversion circuit obtained by converting the output of the first AD conversion circuit from the input analog signal of the first stage or subtracts the output signal of the common DA conversion circuit obtained by converting the output of the second AD conversion circuit from the input analog signal of the second stage; a common amplifier circuit which amplifies the output of the common subtractor circuit with a predetermined amplification factor; a first stage switch which turns on or off the delivery of the input analog signal of the first stage to the common subtractor circuit and the delivery of the output of the first AD conversion circuit to the common DA conversion circuit; and a second stage switch which turns on or off the delivery of the input analog signal of the second stage to the common subtractor circuit and the delivery of the output of the second AD conversion circuit to the common DA conversion circuit.

This aspect allows the first and second stages to share the DA conversion circuit, the subtractor circuit, and the amplifier circuit, thereby providing a reduced circuit area. This aspect also makes it possible to alternate between the first stage and the second stage switches with a predetermined timing to supply a signal to the DA conversion circuit and the subtractor circuit, thereby implementing a reduced circuit area without impairing the conversion speed.

The common subtractor circuit and the common amplifier circuit may be an integrated subtractor amplifier circuit. This configuration provides a further reduced circuit area.

Another aspect according to the present invention also provides an analog-to-digital converter which has at least two or more stages. In this analog-to-digital converter, one of the stages comprises a common amplifier circuit which selectively amplifies, with a predetermined amplification factor, a differential signal between an input analog signal of the self-stage and a signal obtained by converting a converted digital value of the self-stage into an analog value, or a differential signal between an analog signal of another stage and a signal obtained by converting a converted digital value of the another stage into an analog value.

This aspect allows one and another stages to share the amplifier circuit, thereby providing a reduced circuit area. This aspect also makes it possible to switch alternately between signals from the self-stage and another stage with the predetermined timing for input to the amplifier circuit, thereby implementing a reduced circuit area without impairing the conversion speed.

Another aspect according to the present invention also provides an analog-to-digital converter which has at least two or more stages. This analog-to-digital converter comprises: a first AD conversion circuit which converts an input analog signal of a first stage into a digital value of a predetermined number of bits; a first DA conversion circuit which converts the output of the first AD conversion circuit into an analog signal; a first subtractor circuit which subtracts an output signal of the first DA conversion circuit from the input analog signal of the first stage; a second AD conversion circuit which converts an input analog signal of a second stage subsequent to the first stage into a digital value of a predetermined number of bits; a second DA conversion circuit which converts the output of the second AD conversion circuit into an analog signal; a second subtractor circuit which subtracts the output signal of the second DA conversion circuit from the input analog signal of the first stage; a common amplifier circuit which selectively amplifies the output signal of the first subtractor circuit or the output signal of the second subtractor circuit with a predetermined amplification factor; a first stage switch which turns on or off the delivery of the output signal of the first subtractor circuit to the common amplifier circuit; and a second stage switch which turns on or off the delivery of the output signal of the second subtractor circuit to the common amplifier circuit.

This aspect allows the first and second stages to share the amplifier circuit, thereby providing a reduced circuit area. This aspect also makes it possible to alternate between the first stage and the second stage switches with the predetermined timing to input a signal to the amplifier circuit, thereby implementing a reduced circuit area without impairing the conversion speed.

The aforementioned aspects may further include an amplification control circuit which variably controls the amplification factor of the common amplifier circuit. This configuration allows the amplification control circuit to vary the amplification factor of the common amplifier circuit and thus share the common amplifier circuit even when different amplification factors are desired to be used with the common amplifier circuit in one stage and another, thus providing a reduced circuit area.

Any one of two or more stages may subtract between a signal obtained by amplifying the input analog signal of the self-stage with a predetermined amplification factor and a signal, amplified with substantially the same amplification factor as the predetermined amplification factor, obtained by converting a converted digital value of the self-stage into an analog value. In a stage, during an AD conversion, the input signal of the self-stage is amplified with the predetermined amplification factor, thereby reducing the amplification factor of the common amplifier circuit to make the entire AD converter to operate at higher speeds. The "predetermined amplification factor" includes an amplification factor of unity for implementing a sample-and-hold operation.

Incidentally, any combinations of the foregoing components, and the components and expressions of the present invention having their methods, apparatuses, systems, and the like replaced mutually are also intended to constitute applicable aspects of the present invention.

DETAILED DESCRIPTION OF THE INVENTION (First Group)

(First Embodiment)

An AD converter of this embodiment performs an analog-to-digital conversion separately in four steps, using different AD conversion circuits and sample-and-hold circuits in the first step AD conversion and in the second and subsequent step AD conversions. As for the other components, i.e., the DA conversion circuit, the subtractor circuit, and the amplifier circuit, the same circuits are used throughout all the steps from the first to the fourth. When the analog-to-digital conversion of an input analog signal has reached the start of the fourth step, the first step of the analog-to-digital conversion of the next input analog signal is simultaneously started, thereby improving the entire processing speed. At the same time, the circuits other than the AD conversion circuit and the sample-and-hold circuit are shared in all the steps, thereby making it possible to prevent an increase in circuit area.

Figure 1:
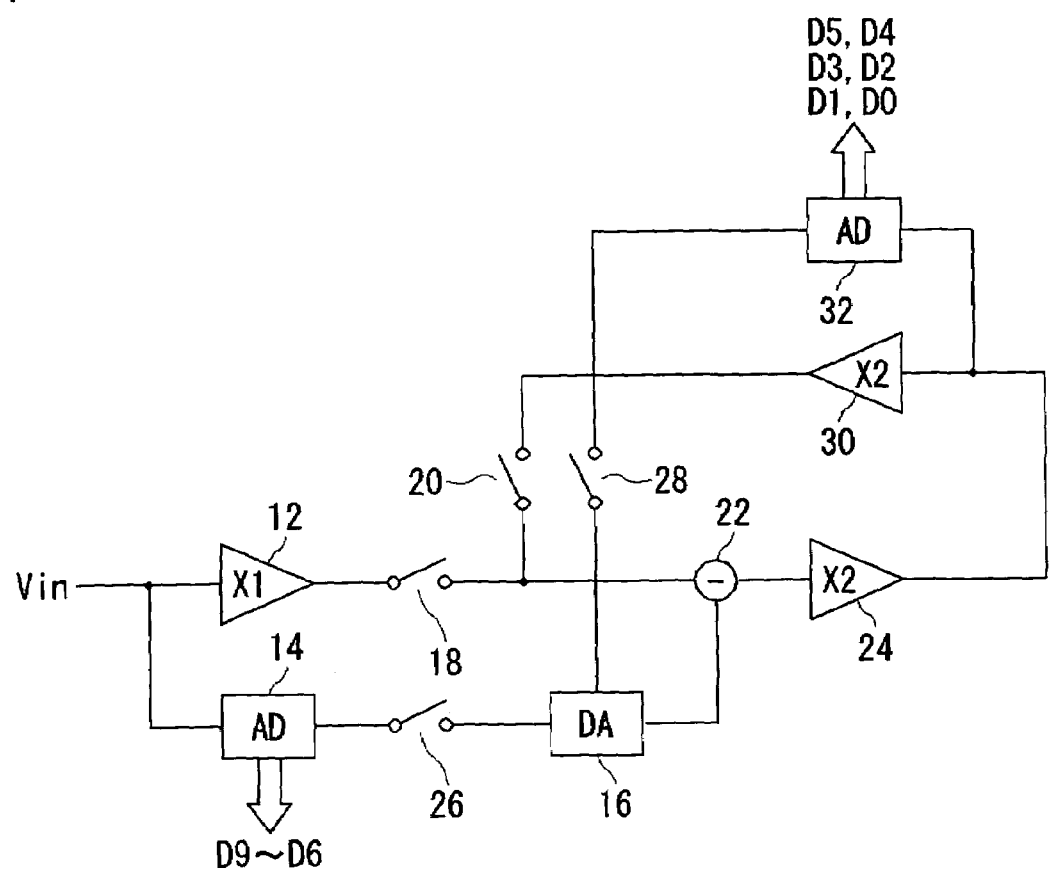
FIG. 1 is a view showing the configuration of an AD converter according to a first embodiment.

FIG. 1 shows the configuration of an AD converter according to a first embodiment. In an AD converter 10, an input analog signal Vin is input to a first sample-and-hold circuit 12 and a first AD conversion circuit 14. The first AD conversion circuit 14 converts the analog value of the input analog signal Vin into a digital value of four bits for output. The digital value of four bits serves as the value of the higher-order four bits (D9-D6) of the digital value of 10 bits that are eventually produced by the AD converter 10. The digital value output by the first AD conversion circuit 14 is input to a DA conversion circuit 16 through a third switch 26 and then converted into an analog value in the DA conversion circuit 16. The first sample-and-hold circuit 12, which samples and holds the input analog signal Vin, has an amplification factor of unity. The input analog signal Vin held in the first sample-and-hold circuit 12 is input to a subtractor circuit 22 through a first switch 18. The subtractor circuit 22 outputs the difference between the analog value output by the DA conversion circuit 16 and the analog value held in the first sample-and-hold circuit 12. An amplifier circuit 24, which amplifies the output from the subtractor circuit 22 for feedback of the resulting signal for the subsequent AD conversion, has an amplification factor of two. The subtractor circuit 22 and the amplifier circuit 24 may be integrated into a subtractor amplifier circuit.

The analog signal delivered by the amplifier circuit 24 is input to a second sample-and-hold circuit 30 and a second AD conversion circuit 32. The second AD conversion circuit 32 converts the value of the supplied analog signal into the digital value of two bits for output. The digital value delivered by the second AD conversion circuit 32 is input to the DA conversion circuit 16 through a fourth switch 28, and then converted into an analog value in the DA conversion circuit 16. The second sample-and-hold circuit 30, which samples and holds the supplied analog signal, has an amplification factor of two. The analog value held in the second sample-and-hold circuit 30 is sent to the subtractor circuit 22 through a second switch 20. The second switch 20 and the fourth switch 28 are turned on in the second and third steps whereas being turned off in the first and fourth steps. The subtractor circuit 22 outputs the difference between the analog value delivered by the DA conversion circuit 16 and the analog value held in the second sample-and-hold circuit 30 to the amplifier circuit 24. The amplifier circuit 24 amplifies the output from the subtractor circuit 22 for feedback to the second sample-and-hold circuit 30 and the second AD conversion circuit 32.

The amplifier circuit 24 performs the feedback-based cyclic processing three times. When the first AD conversion circuit 14 performs the first step AD conversion for the first time, the first switch 18 and the third switch 26 are turned on whereas the second switch 20 and the fourth switch 28 are turned off. During circulation, the first switch 18 and the third switch 26 are turned off whereas the second switch 20 and the fourth switch 28 are turned on. The digital values output by the second AD conversion circuit 32 during circulation are those of the fifth and sixth bits (D5 and D4), the seventh and eighth bits (D3 and D2), and the ninth and tenth bits (D1 and D0) from the most significant bit in the digital value of 10 bits eventually delivered by the AD converter 10. In this manner, the higher-order four bits of the 10 bits are converted by means of the first AD conversion circuit 14 while the lower-order six bits are converted by the second AD conversion circuit 32. The second AD conversion circuit 32 has a processing speed setting three times higher than that of the first AD conversion circuit 14. Thus, the first AD conversion circuit 14 and the second AD conversion circuit 32 perform different amounts of processing but require the same amount of time for conversion. It is thus possible for the first AD conversion circuit 14 and the second AD conversion circuit 32 to perform simultaneous processing in parallel.

Figure 2:
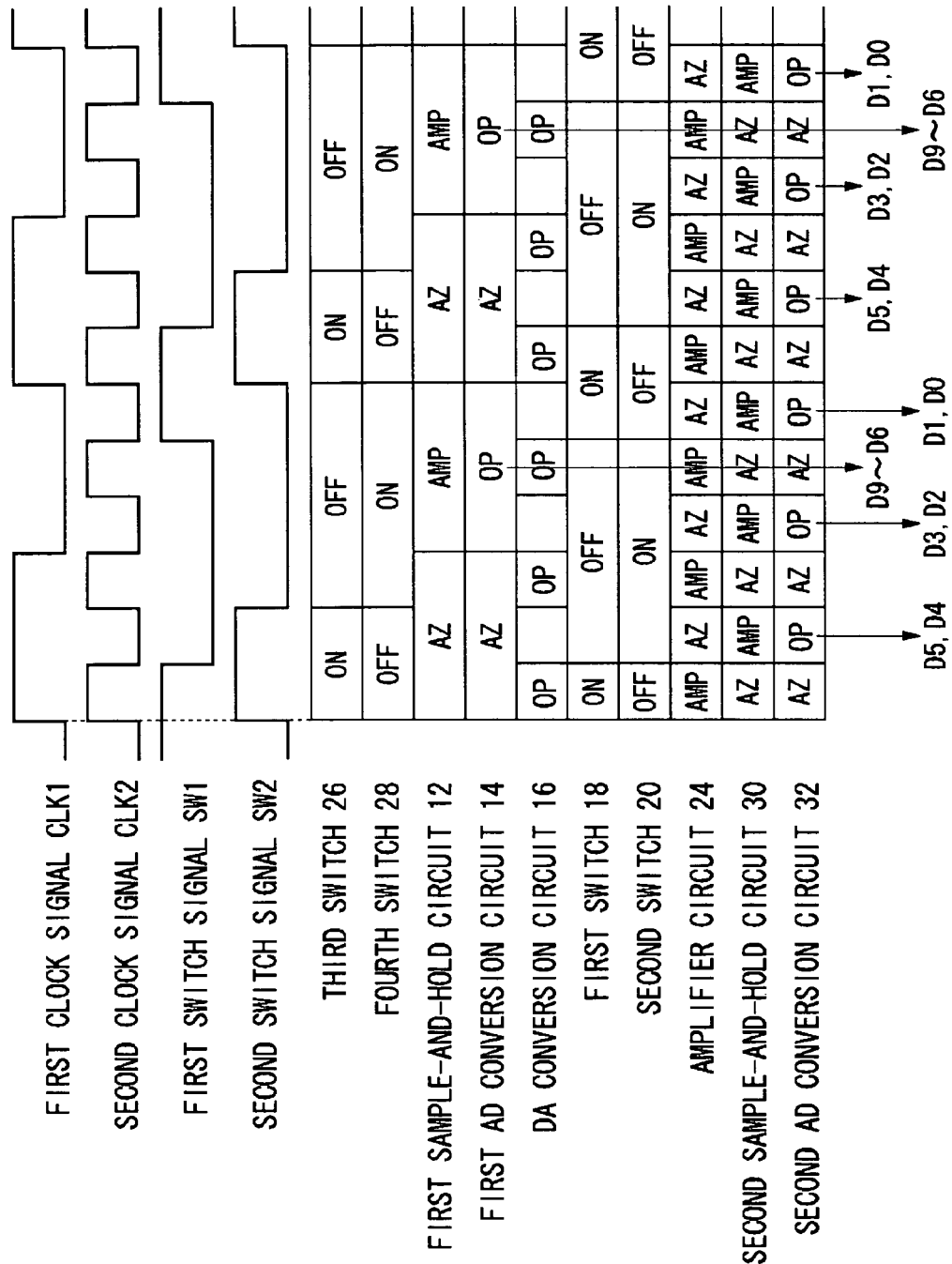
FIG. 2 is a time chart showing the operation process of an AD converter.

FIG. 2 is a time chart showing the operation process of the AD converter 10. Now, an explanation of the chart will be given step by step starting at the top. The four signal waveforms indicate a first clock signal CLK1, a second clock signal CLK2, a first switch signal SW1, and a second switch signal SW2. The first clock signal CLK1 controls the operation of the first sample-and-hold circuit 12 and the first AD conversion circuit 14. The second clock signal CLK2 controls the operation of the DA conversion circuit 16, the amplifier circuit 24, the second sample-and-hold circuit 30, and the second AD conversion circuit 32. The first switch signal SW1 controls on/off status of the first switch 18, while its inverted signal controls on/off status of the second switch 20. The second switch signal SW2 controls on/off status of the third switch 26, while its inverted signal controls on/off status of the fourth switch 28.

The second clock signal CLK2 has a frequency three times higher than that of the first clock signal CLK1. The second clock signal CLK2 may be produced by dividing the first clock signal CLK1. The second clock signal CLK2 has a rising edge synchronized with that of the first clock signal CLK1, the subsequent second falling edge synchronized with the subsequent falling edge of the first clock signal CLK1, and the further subsequent second rising edge synchronized with the subsequent rising edge of the first clock signal CLK1. The frequency of the second clock signal CLK2 three times higher than that of the first clock signal CLK1 will cause the second AD conversion circuit 32 to perform conversions in the second to the fourth steps three times faster than the first AD conversion circuit 14 performing the conversion in the first step. The multistage pipelined AD converter is required for a higher conversion accuracy in earlier steps in which higher-order bits are converted. In other words, the second and subsequent steps are not required for a higher accuracy than in the first step. Accordingly, the second AD conversion circuit 32 is adapted, without taking its conversion accuracy into special consideration, to perform conversions faster than the first AD conversion circuit 14.

The first switch signal SW1 has a cycle which is the same as that of the first clock signal CLK1 and three times that of the second clock signal CLK2. The first switch signal SW1 has a falling edge synchronized with that of the second clock signal CLK2, and the following rising edge synchronized with the subsequent second falling edge of the second clock signal CLK2. The second switch signal SW2 has a cycle which is the same as that of the first clock signal CLK1 and three times that of the second clock signal CLK2. The second switch signal SW2 has a rising edge synchronized with that of the second clock signal CLK2, and the following falling edge synchronized with the subsequent rising edge of the second clock signal CLK2.

The third switch 26 is turned on when the second switch signal SW2 is high, and turned off when the second switch signal SW2 is low. The fourth switch 28 is turned on when the second switch signal SW2 is low, and turned off when the second switch signal SW2 is high. The first sample-and-hold circuit 12 amplifies the input analog signal Vin when the first clock signal CLK1 is low, and performs an auto-zero operation when the first clock signal CLK1 is high. The first AD conversion circuit 14 performs conversions to output digital values D9 to D6 when the first clock signal CLK1 is low, and performs an auto-zero operation when the first clock signal CLK1 is high. The DA conversion circuit 16 performs the second and third step DA conversions when the second clock signal CLK2 is high, and becomes floating when the second clock signal CLK2 is low. The DA conversion circuit 16 also performs the first step DA conversion with the timing immediately after the first AD conversion circuit 14 has performed a conversion.

The first switch 18 is turned on when the first switch signal SW1 is high, and turned off when the first switch signal SW1 is low. The second switch 20 is turned on when the first switch signal SW1 is low, and turned off when the first switch signal SW1 is high. The amplifier circuit 24 amplifies the output from the subtractor circuit 22 when the second clock signal CLK2 is high, and performs an auto-zero operation when the second clock signal CLK2 is low.

The second sample-and-hold circuit 30 amplifies an input analog signal when the second clock signal CLK2 is low, and performs an auto-zero operation when the second clock signal CLK2 is high. The second AD conversion circuit 32 performs the second to fourth step AD conversions of the input analog signal when the second clock signal CLK2 is low, and performs an auto-zero operation when the second clock signal CLK2 is high.

As shown, while the second AD conversion circuit 32 performs conversions of D3 and D2, and D1 and D0, the first AD conversion circuit 14 concurrently performs a conversion of an input analog signal Vin subsequently supplied. This pipelined processing makes it possible for the entire AD converter 10 to output a digital value of 10 bits once in a cycle with respect to the first clock signal CLK1. In the fourth step, immediately after the second AD conversion circuit 32 has output D1 and D0, the DA conversion circuit 16, the subtractor circuit 22, and the amplifier circuit 24 are not utilized in the fourth step processing, thus being used with that timing in the first step processing on the subsequent input analog signal Vin.

As described above, this embodiment allows the first AD conversion circuit 14 to perform only the first step AD conversion, and then allows the cyclic circuits mainly of the second AD conversion circuit 32 to perform the remaining second to fourth steps repeatedly. This allows the pipelined processing to be performed in the first and subsequent steps. The DA conversion circuit 16, the subtractor circuit 22, and the amplifier circuit 24 are not utilized in the fourth step, and thus employed in the first step for the processing of the subsequent input analog signal Vin with the timing originally for the fourth step. The pipelined processing can be implemented only by adding the first AD conversion circuit 14 and the first sample-and-hold circuit 12 to the conventional cyclic AD converter, without adding a DA conversion circuit, a subtractor circuit, and an amplifier circuit thereto. Accordingly, it is possible to improve the processing speed for an analog-to-digital conversion while preventing an increase in circuit area.

(Second Embodiment)

This embodiment is the same as the first embodiment in that the AD converter performs an analog-to-digital conversion separately in four steps, but different therefrom in that the amplifier circuit which is not used in the fourth step is utilized for the processing in the first step. Here, the amplifier circuit in the fourth step is used as a comparator in the first step to compare the input analog signal Vin with a reference voltage. The comparison result is used for adjustment of the range of the input analog signal Vin.

Figure 3:
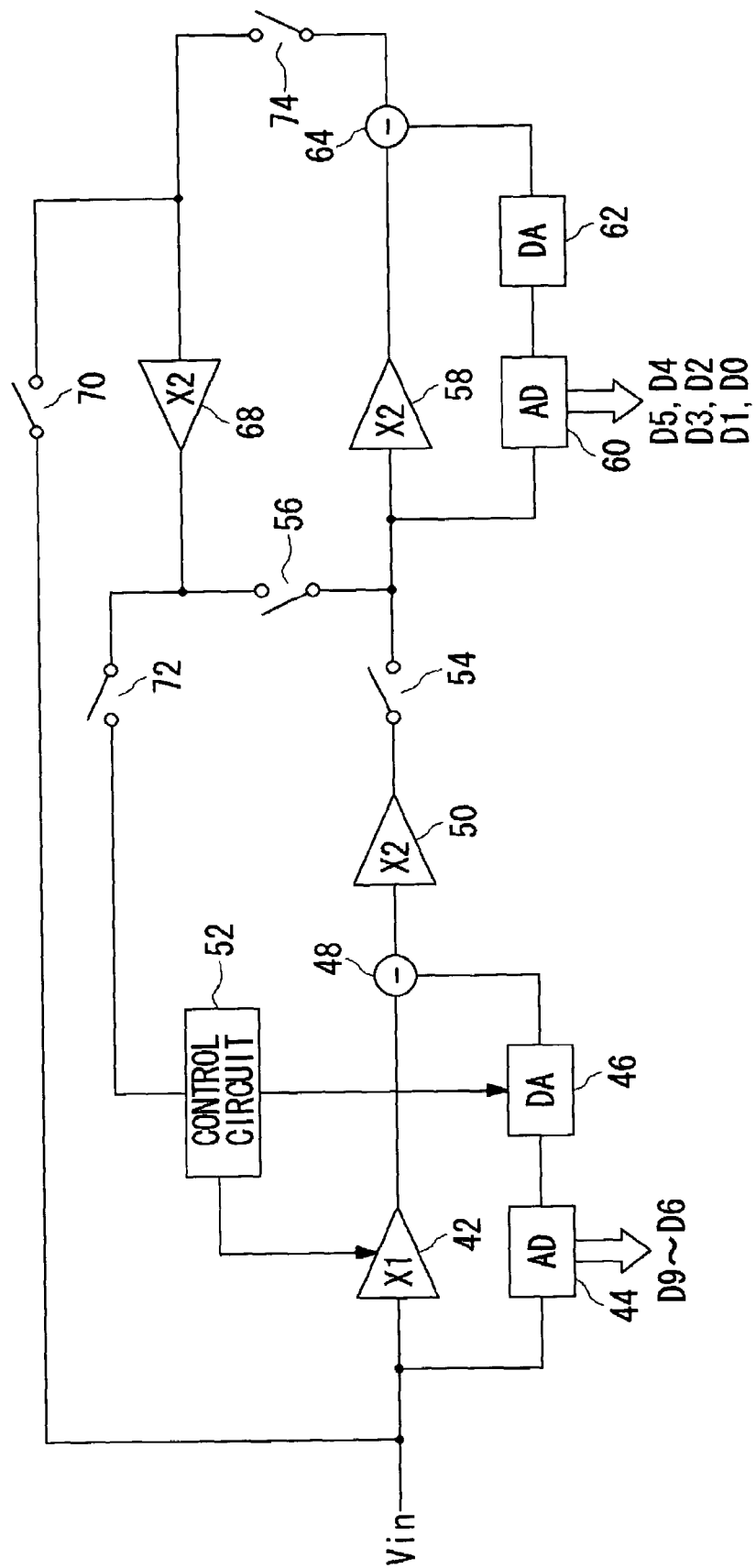
FIG. 3 is a view showing the configuration of an AD converter according to a second embodiment.

FIG. 3 shows the configuration of an AD converter according to a second embodiment. In an AD converter 40, an input analog signal Vin is supplied to a first sample-and-hold circuit 42 and a first AD conversion circuit 44. The first AD conversion circuit 44 converts the value of the supplied analog signal into a digital value of four bits for output. The digital value output by the first AD conversion circuit 44 is converted into an analog value in a first DA conversion circuit 46. The first sample-and-hold circuit 42, which samples and holds the input analog signal, has an amplification factor of unity.

A first subtractor circuit 48 outputs the difference between the analog value output by the first DA conversion circuit 46 and the analog value held in the first sample-and-hold circuit 42. A first amplifier circuit 50, which amplifies the output from the first subtractor circuit 48, has an amplification factor of two. The signal amplified by the first amplifier circuit 50 is input to a second sample-and-hold circuit 58 and a second AD conversion circuit 60 through a first switch 54. The second AD conversion circuit 60 converts the value of the input analog signal into the digital value of two bits for output. A second DA conversion circuit 62 converts the digital value output by the second AD conversion circuit 60 into an analog value. The second sample-and-hold circuit 58, which samples and holds the input analog signal, has an amplification factor of two. A second subtractor circuit 64 outputs the difference between the analog value output by the second DA conversion circuit 62 and the analog value held in the second sample-and-hold circuit 58. The output from the second subtractor circuit 64 is input to a second amplifier circuit 68 through a fifth switch 74. The second amplifier circuit 68, which amplifies the output from the second subtractor circuit 64 for feedback to the second sample-and-hold circuit 58 and the second AD conversion circuit 60, has an amplification factor of two. The second subtractor circuit 64 and the second amplifier circuit 68 may also be integrated into a subtractor amplifier circuit. The feedback from the second amplifier circuit 68 is input to the second sample-and-hold circuit 58 and the second AD conversion circuit 60 through a second switch 56.

The second amplifier circuit 68 performs the feedback-based cyclic processing three times. When the second AD conversion circuit 60 performs the second step AD conversion after the first AD conversion circuit 44 performs the first step AD conversion, the first switch 54 is turned on whereas the second switch 56 is turned off. During circulation, the first switch 54 is turned off, whereas the second switch 56 and the fifth switch 74 are turned on. The digital values output by the second AD conversion circuit 60 during circulation are those of the fifth and sixth bits (D5 and D4), the seventh and eighth bits (D3 and D2), and the ninth and tenth bits (D1 and D0) from the most significant bit in the digital value eventually output by the AD converter 40. In this manner, the higher-order four bits of the 10 bits are converted by means of the first AD conversion circuit 44 in the first step, while the lower-order six bits are converted by the second AD conversion circuit 60 in the second to fourth steps. The second AD conversion circuit 60 has a processing speed setting higher than that of the first AD conversion circuit 44. The first AD conversion circuit 44 and the second AD conversion circuit 60 perform different amounts of processing but require the same amount of time for conversion. It is thus possible for the first AD conversion circuit 44 and the second AD conversion circuit 60 to perform simultaneous processing in parallel.

Here, the output voltage from the first sample-and-hold circuit 42 is theoretically proportional to the voltage value of the input analog signal Vin; however, a proportional output is not always obtained beyond an effective output range that is defined from the characteristics of the circuit. Therefore, there is a risk that an accurate value cannot be provided depending on the input voltage value, thereby causing degradation in conversion accuracy of the entire AD converter 40. In this context, the value of the input analog signal Vin supplied to the first sample-and-hold circuit 42 is adjusted so as to fall within a range in which the first AD conversion circuit 44 provides a good conversion performance. To this end, the input analog signal Vin is also supplied to the second amplifier circuit 68 through a third switch 70, while the second amplifier circuit 68 determines the range of the input analog signal Vin. Based on the determination result provided by the second amplifier circuit 68, a control circuit 52 provides a reference signal with a level setting such that the input analog signal Vin falls within the range for a good conversion performance. The reference signal is input to the first sample-and-hold circuit 42 and the first DA conversion circuit 46, where the first sample-and-hold circuit 42 holds a value obtained by making an adjustment to the input analog signal Vin using the reference signal. This allows for maintaining the proportional relation between the output and input values of the first sample-and-hold circuit 42. Using the reference signal, the first DA conversion circuit 46 eliminates a temporary variation added to the value held by the first sample-and-hold circuit 42.

In the first and fourth steps, the second switch 56 and the fifth switch 74 are turned off, while the third switch 70 and a fourth switch 72 are turned on. Conversely, in the second and third steps, the third switch 70 and the fourth switch 72 are turned off, while the second switch 56 and the fifth switch 74 are turned on. However, in the fourth step, the second switch 56 is turned off after the feedback from the second amplifier circuit 68 is input to the second sample-and-hold circuit 58 and the second AD conversion circuit 60.

Figure 4:
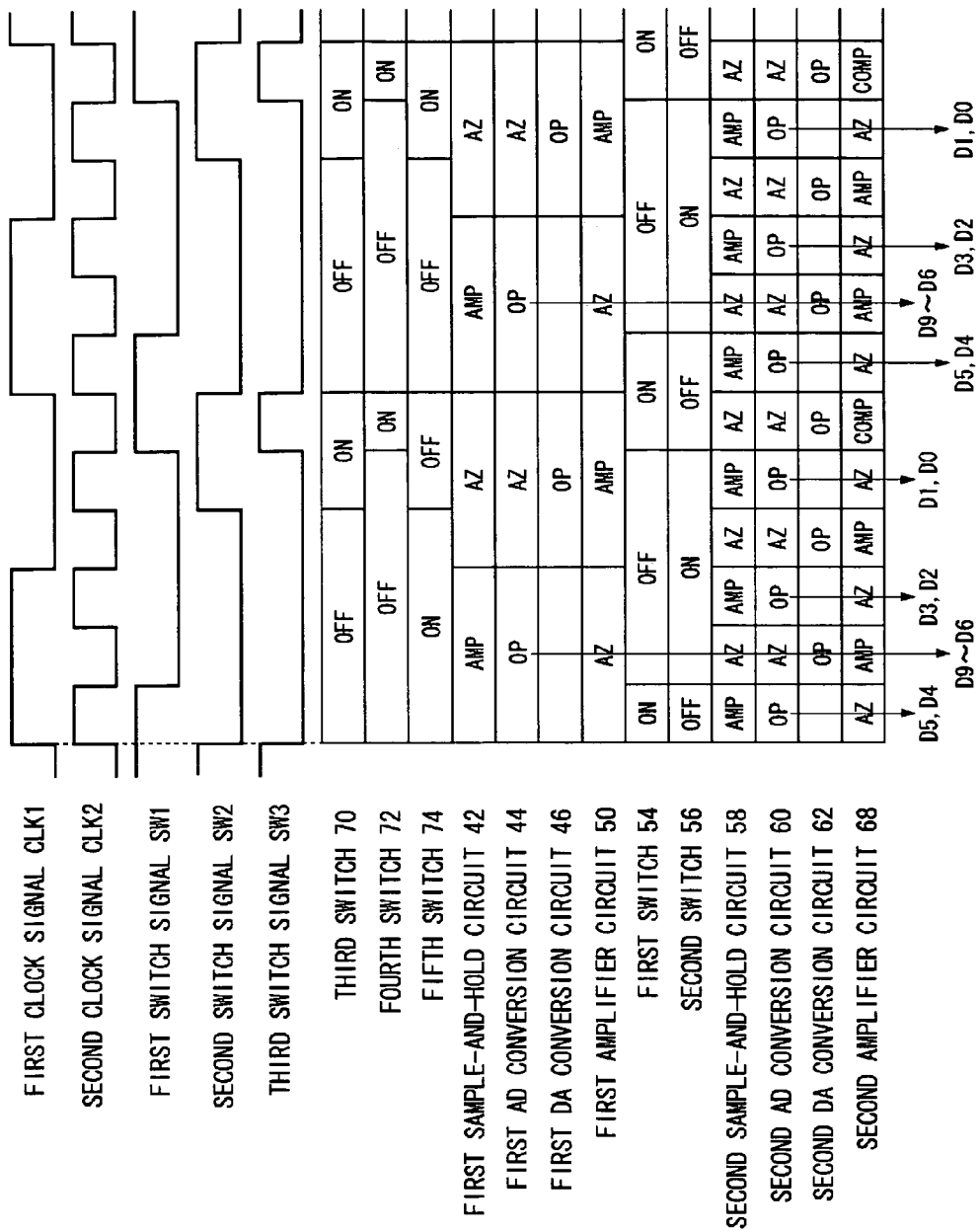
FIG. 4 is a time chart showing the operation process of an AD converter.

FIG. 4 is a time chart showing the operation process of the AD converter 40. Now, an explanation of the chart will be given step by step starting at the top. The five signal waveforms indicate a first clock signal CLK1, a second clock signal CLK2, a first switch signal SW1, a second switch signal SW2, and a third switch signal SW3. The first clock signal CLK1 controls the operation of the first sample-and-hold circuit 42, the first AD conversion circuit 44, the first DA conversion circuit 46, and the first amplifier circuit 50. The second clock signal CLK2 controls the operation of the second sample-and-hold circuit 58, the second AD conversion circuit 60, the second DA conversion circuit 62, and the second amplifier circuit 68. The first switch signal SW1 controls on/off status of the first switch 54, while its inverted signal controls on/off status of the second switch 56. The second switch signal SW2 controls on/off status of the third switch 70, while its inverted signal controls on/off status of the fifth switch 74. The third switch signal SW3 controls on/off status of the fourth switch 72.

The first clock signal CLK1 and the second clock signal CLK2 have the same cycle, frequency, and waveform as those of the first clock signal CLK1 and the second clock signal CLK2 of the first embodiment. That is, since the second clock signal CLK2 has a frequency three times higher than that of the first clock signal CLK1, the second AD conversion circuit 60 performs conversions in the second to fourth steps threes times faster than the first AD conversion circuit 44 in the first step. The first switch signal SW1 has the same cycle, frequency, and waveform as those of the first switch signal SW1 of the first embodiment. The cycle of the second switch signal SW2 is the same as that of the first clock signal CLK1 and three times that of the second clock signal CLK2. The second switch signal SW2 has a falling edge synchronized with the rising edge of the second clock signal CLK2, and the following rising edge synchronized with the subsequent second rising edge of the second clock signal CLK2. The cycle of the third switch signal SW3 is also the same as that of the first clock signal CLK1 and three times that of the second clock signal CLK2. The third switch signal SW3 has a falling edge synchronized with the rising edge of the second clock signal CLK2, and the following rising edge synchronized with the subsequent third falling edge of the second clock signal CLK2.

The third switch 70 is turned on when the second switch signal SW2 is high, and turned off when the second switch signal SW2 is low. The fourth switch 72 is turned on when the third switch signal SW3 is high, and turned off when the third switch signal SW3 is low. The fifth switch 74 is turned on when the second switch signal SW2 is low, and turned off when the second switch signal SW2 is high. The first sample-and-hold circuit 42 amplifies the input analog signal Vin when the first clock signal CLK1 is high, and performs an auto-zero operation when the first clock signal CLK1 is low. The first AD conversion circuit 44 performs conversions to output digital values D9 to D6 when the first clock signal CLK1 is high, and performs an auto-zero operation when the first clock signal CLK1 is low. The DA conversion circuit 46 performs the first step DA conversion when the first clock signal CLK1 is low, and becomes floating when the first clock signal CLK1 is high. The first amplifier circuit 50 amplifies the output from the first subtractor circuit 48 when the first clock signal CLK1 is low, and performs an auto-zero operation when the first clock signal CLK1 is high.

The operation timing of the first switch 54 and the second switch 56 is the same as that of the first switch 18 and the second switch 20 in the first embodiment. The second sample-and-hold circuit 58 amplifies the input analog signal when the second clock signal CLK2 is high, and performs an auto-zero operation when the second clock signal CLK2 is low. The second AD conversion circuit 60 performs the second to fourth step AD conversions when the second clock signal CLK2 is high, and performs an auto-zero operation when the second clock signal CLK2 is low. The second DA conversion circuit 62 performs the second and third step DA conversions when the second clock signal CLK2 is low, and becomes floating when the second clock signal CLK2 is high. The second amplifier circuit 68 amplifies the output from the second subtractor circuit 64 when the second clock signal CLK2 is low, and performs an auto-zero operation when the second clock signal CLK2 is high. However, when the second clock signal CLK2 is low in the fourth step, the second amplifier circuit 68 operates as a comparator in the first step.

As shown, while the second AD conversion circuit 60 performs conversions of D5 to D0, the first AD conversion circuit 44 concurrently performs a conversion of an input analog signal Vin subsequently supplied. This pipelined processing makes it possible for the entire AD converter 40 to output a digital value of 10 bits once in a cycle with respect to the first clock signal CLK1. In the fourth step, immediately after the second AD conversion circuit 60 has output D1 and D0, the second amplifier circuit 68 needs not to amplify the output from the second subtractor circuit 64, thus being used as a comparator with that timing in the first step processing on the subsequent input analog signal Vin.

As described above, this embodiment allows the first AD conversion circuit 44 to perform the first step AD conversion, and then allows the cyclic circuits mainly of the second AD conversion circuit 60 to perform the remaining second to fourth steps sequentially. This distribution of load allows the pipelined processing to be performed in the first and subsequent steps. The second amplifier circuit 68 performs the second and third step amplifications sequentially but is not utilized in the first and fourth step amplifications, and is thus employed in the first step for the processing of the subsequent input analog signal Vin with the timing for the fourth step. Accordingly, it is possible to improve the processing speed for an analog-to-digital conversion and make effective use of the amplifier circuit while preventing an increase in circuit area.

(Third Embodiment)

This embodiment is the same as the first and second embodiments in that the AD converter performs an analog-to-digital conversion separately in four steps, but different from the second embodiment in that the DA conversion circuit which is not used in the fourth step is utilized for the processing in the first step. Here, the DA conversion circuit in the fourth step is additionally used in the first step. That is, the first step DA conversion can employ a DA conversion of a total of four bits, which is implemented by utilizing the combination of a DA conversion circuit of two bits for use in the first step and a DA conversion circuit of two bits for use in the second and third steps.

Figure 5:
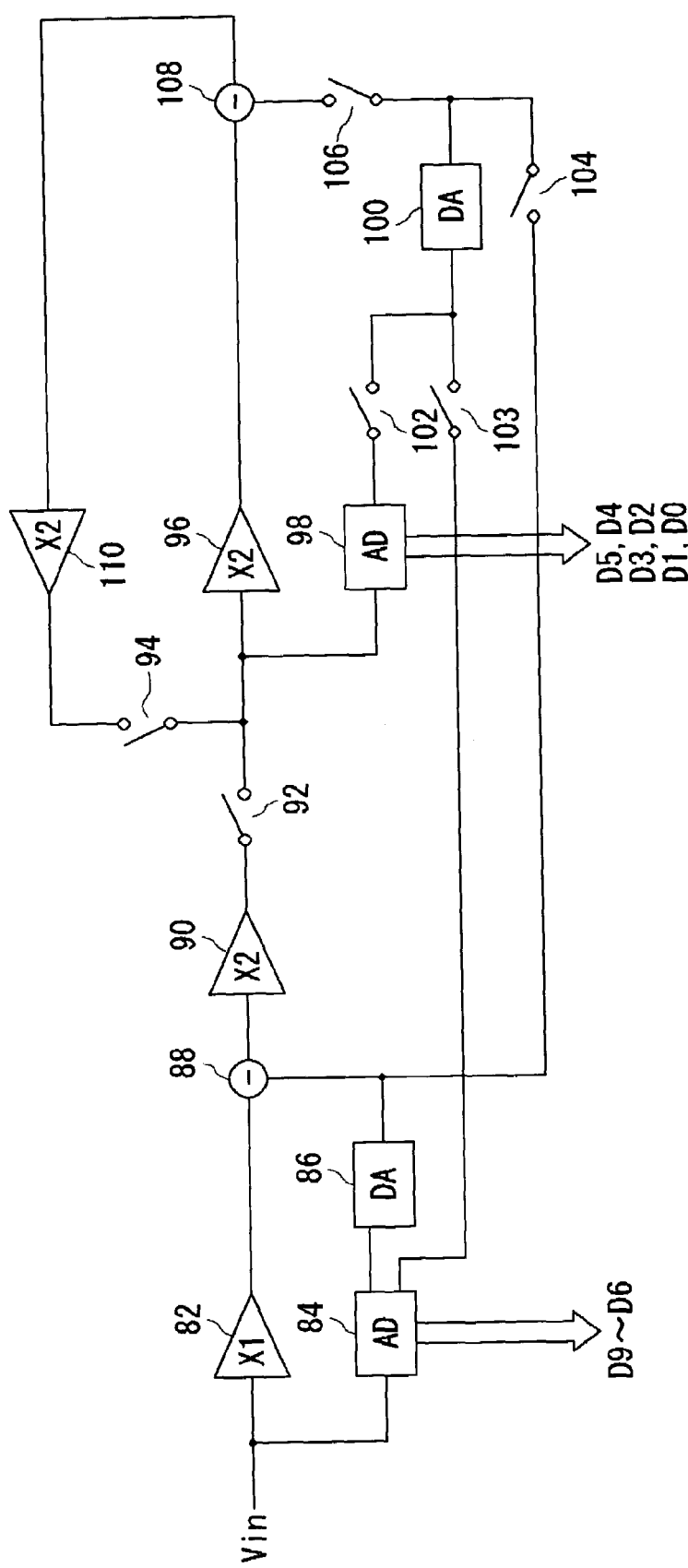
FIG. 5 is a view showing the configuration of an AD converter according to a third embodiment.

FIG. 5 shows the configuration of an AD converter according to a third embodiment. In an AD converter 80, an input analog signal Vin is input to a first sample-and-hold circuit 82 and a first AD conversion circuit 84. The first AD conversion circuit 84 converts the value of the supplied analog signal into a digital value of four bits (D9-D6) for output. Two bits of the digital value delivered by the first AD conversion circuit 84 are converted into an analog value in a first DA conversion circuit 86. The remaining two bits are converted into an analog value in a second DA conversion circuit 100, described later. The first DA conversion circuit 86 and the second DA conversion circuit 100 are a three bit DA conversion circuit, each containing one redundant bit. The first sample-and-hold circuit 82, which samples and holds the supplied analog signal, has an amplification factor of unity.

A first subtractor circuit 88 outputs the difference between the analog value output by the first DA conversion circuit 86 and the second DA conversion circuit 100 and the analog value held in the first sample-and-hold circuit 82. A first amplifier circuit 90, which amplifies the output from the first subtractor circuit 88, has an amplification factor of two. The signal amplified by the first amplifier circuit 90 is input to a second sample-and-hold circuit 96 and a second AD conversion circuit 98 through a first switch 92. The second AD conversion circuit 98 converts the value of the input analog signal into the digital value of two bits for output. The second DA conversion circuit 100 converts the digital value output from the second AD conversion circuit 98 through a third switch 102 or the digital value output from the first AD conversion circuit 84 through a sixth switch 103 into an analog value. The second sample-and-hold circuit 96 samples and holds the input analog signal. A second subtractor circuit 108 outputs the difference between the analog value input from the second DA conversion circuit 100 through a fifth switch 106 and the analog value held in the second sample-and-hold circuit 96. A second amplifier circuit 110, which amplifies the output from the second subtractor circuit 108 for feedback to the second sample-and-hold circuit 96 and the second AD conversion circuit 98, has an amplification factor of two. The feedback from the second amplifier circuit 110 is input to the second sample-and-hold circuit 96 and the second AD conversion circuit 98 through a second switch 94.

The second amplifier circuit 110 performs the feedback-based cyclic processing three times. When the second AD conversion circuit 98 performs the second step AD conversion after the first AD conversion circuit 84 performs the first step AD conversion, the first switch 92 is turned on whereas the second switch 94 is turned off. During circulation, the first switch 92 is turned off, whereas the second switch 94 is turned on. The digital values output by the second AD conversion circuit 98 during circulation are those of the fifth and sixth bits (D5 and D4), the seventh and eighth bits (D3 and D2), and the ninth and tenth bits (D1 and D0) from the most significant bit in the digital value eventually output by the AD converter 80. In this manner, the higher-order four bits of the 10 bits are converted by means of the first AD conversion circuit 84 in the first step, while the lower-order six bits are converted by the second AD conversion circuit 98 in the second to fourth steps. The second AD conversion circuit 98 has a processing speed setting three times higher than that of the first AD conversion circuit 84. Thus, the first AD conversion circuit 84 and the second AD conversion circuit 98 perform different amounts of processing but require the same amount of time for conversion. It is thus possible for the first AD conversion circuit 84 and the second AD conversion circuit 98 to perform simultaneous processing in parallel.

Here, when the second DA conversion circuit 100 is utilized in a DA conversion in the second and third steps, the third switch 102 and the fifth switch 106 are turned on while a fourth switch 104 and the sixth switch 103 are turned off. When the second DA conversion circuit 100 is utilized in a DA conversion in the first and fourth steps, the third switch 102 and the fifth switch 106 are turned off while the fourth switch 104 and the sixth switch 103 are turned on. A digital value of two bits is input from the first AD conversion circuit 84 to the second DA conversion circuit 100, and then converted into an analog value in the second DA conversion circuit 100 for output to the first subtractor circuit 88 through the fourth switch 104.

Figure 6:
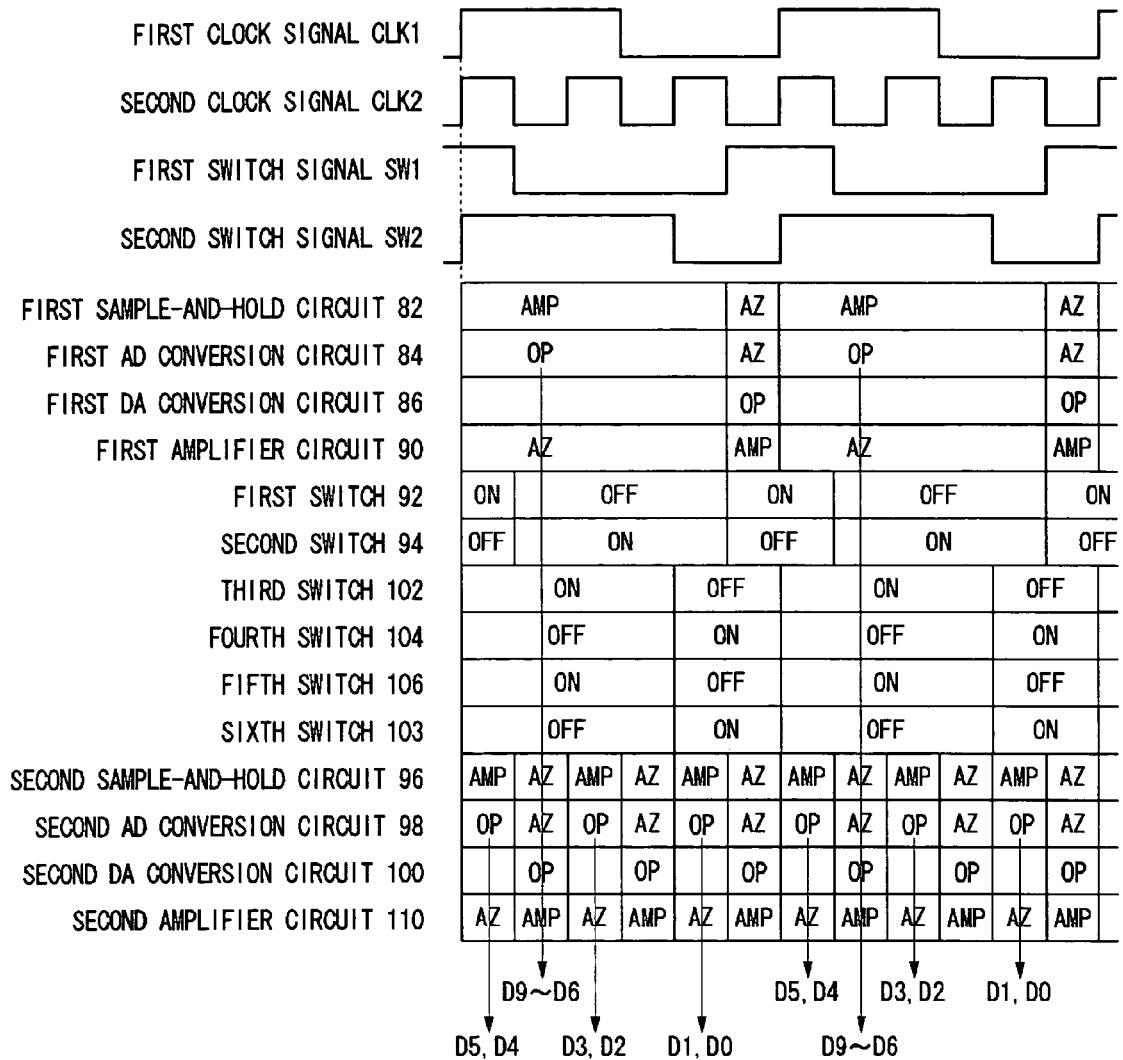
FIG. 6 is a time chart showing the operation process of an AD converter.

FIG. 6 is a time chart showing the operation process of the AD converter 80. Now, an explanation of the chart will be given step by step starting at the top. The four signal waveforms indicate a first clock signal CLK1, a second clock signal CLK2, a first switch signal SW1, and a second switch signal SW2. The first clock signal CLK1 and the second clock signal CLK2 control the operation of the first sample-and-hold circuit 82, the first AD conversion circuit 84, the first DA conversion circuit 86, the first amplifier circuit 90, the second sample-and-hold circuit 96, the second AD conversion circuit 98, the second DA conversion circuit 100, and the second amplifier circuit 110. The first switch signal SW1 controls on/off status of the first switch 92, while its inverted signal controls on/off status of the second switch 94. The second switch signal SW2 controls on/off status of the third switch 102 and the fifth switch 106, while its inverted signal controls on/off status of the fourth switch 104 and the sixth switch 103.

The first clock signal CLK1 and the second clock signal CLK2 have the same cycle, frequency, and waveform as those of the first clock signal CLK1 and the second clock signal CLK2 of the first and second embodiments. The first switch signal SW1 has the same cycle, frequency, and waveform as those of the first switch signal SW1 in the first embodiment. The second switch signal SW2 has the same cycle and frequency as those of the second switch signal SW2 of the first and second embodiments, but has a waveform obtained by inverting that of the second switch signal SW2 of the first and second embodiments. Accordingly, the second switch signal SW2 has a rising edge synchronized with that of the second clock signal CLK2, and the following falling edge synchronized with the subsequent second rising edge of the second clock signal CLK2.

The first sample-and-hold circuit 82 starts amplifying the input analog signal Vin at the rising edge of the first clock signal CLK1, and then starts an auto-zero operation at the third falling edge of the second clock signal CLK2. The first AD conversion circuit 84 starts the first step AD conversion at the rising edge of the first clock signal CLK1, and then starts an auto-zero operation at the third falling edge of the second clock signal CLK2. The first DA conversion circuit 86 starts a DA conversion when the first sample-and-hold circuit 82 and the first AD conversion circuit 84 start an auto-zero operation, and then becomes floating at the subsequent rising edge of the second clock signal CLK2. The first amplifier circuit 90 also starts an amplification when the first sample-and-hold circuit 82 and the first AD conversion circuit 84 start an auto-zero operation, and then starts an auto-zero operation at the subsequent rising edge of the second clock signal CLK2.

The third switch 102 and the fifth switch 106 are turned on when the second switch signal SW2 is high, and turned off when the second switch signal SW2 is low. The fourth switch 104 and the sixth switch 103 are turned on when the second switch signal SW2 is low, and turned off when the second switch signal SW2 is high. The operation timing of the second sample-and-hold circuit 96, the second AD conversion circuit 98, the second DA conversion circuit 100, and the second amplifier circuit 110 is the same as that of the second sample-and-hold circuit 58, the second AD conversion circuit 60, the second DA conversion circuit 62, and the second amplifier circuit 68, respectively.

As shown, while the second AD conversion circuit 98 performs conversions of D5 to D0, the first AD conversion circuit 84 concurrently performs a conversion of an input analog signal Vin subsequently supplied. This pipelined processing makes it possible for the entire AD converter 80 to output a digital value of 10 bits once in a cycle with respect to the first clock signal CLK1. In the fourth step, immediately after the second AD conversion circuit 98 has delivered D1 and D0, the second DA conversion circuit 100 needs not to perform a DA conversion of the output from the second AD conversion circuit 98, thus being used with that timing as an additional DA conversion circuit in the first step for the subsequent input analog signal Vin.

As described above, this embodiment allows the first AD conversion circuit 84 to perform the first step AD conversion, and then allows the cyclic circuits mainly of the second AD conversion circuit 98 to perform the remaining second to fourth steps sequentially. This distribution of load allows the pipelined processing to be performed in the first and subsequent steps. The second DA conversion circuit 100 performs a DA conversion of the output from the second AD conversion circuit 98 in the second and third steps but is not utilized in the DA conversion of the output from the second AD conversion circuit 98 in the first and fourth steps, thus being used with that timing in the first step for the DA conversion of the subsequent input analog signal Vin. Accordingly, it is possible to improve the processing speed for an analog-to-digital conversion and make effective use of the DA conversion circuit while preventing an increase in circuit area. Additionally, it is not necessary to provide a DA conversion circuit, capable of performing an independent conversion of four bits, for use with the DA conversion in the first step, thereby allowing for a reduced circuit area.

(Fourth Embodiment)

This embodiment is the same as the first to third embodiments in that the AD converter performs an analog-to-digital conversion separately in four steps, but different from the second and third embodiments in that the subtractor circuit and the amplifier circuit which are not used in the fourth step are shared for the processing in the first step.

Figure 7:
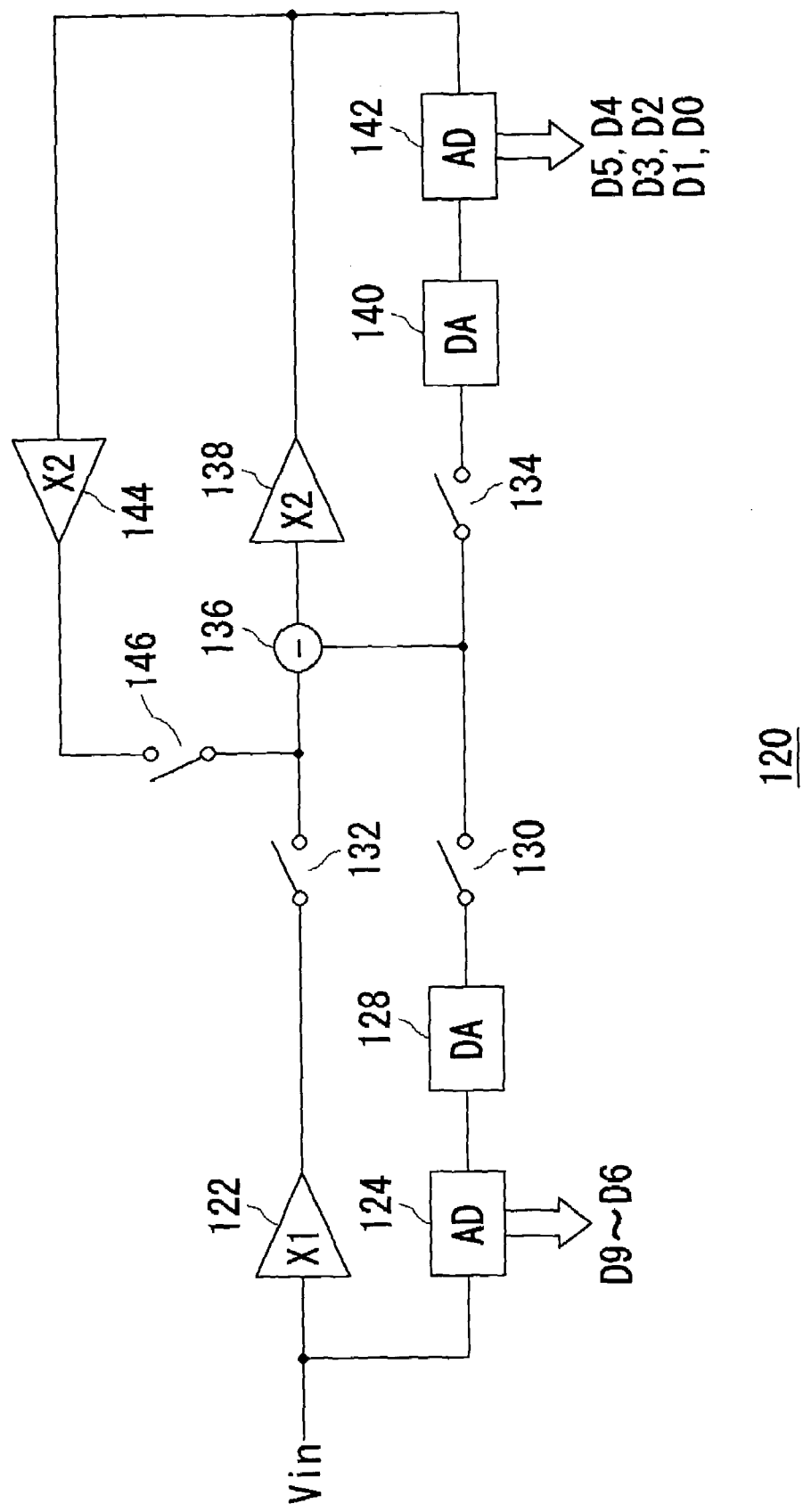
FIG. 7 is a view showing the configuration of a conventional cyclic AD converter.

FIG. 7 shows the configuration of an AD converter according to a fourth embodiment. In an AD converter 120, an input analog signal Vin is input to a first sample-and-hold circuit 122 and a first AD conversion circuit 124. The first AD conversion circuit 124 converts the value of the input analog signal into a digital value of four bits (D9-D6) for output. The digital value output by the first AD conversion circuit 124 is converted into an analog value in a second DA conversion circuit 128. The first sample-and-hold circuit 122, which samples and holds the input analog signal, has an amplification factor of unity.

A subtractor circuit 136 outputs the difference between the analog value input from the second DA conversion circuit 128 through a third switch 130 and the analog value held in the first sample-and-hold circuit 122 and then input through a first switch 132. An amplifier circuit 138, which amplifies the output from the subtractor circuit 136, has an amplification factor of two. The subtractor circuit 136 and the amplifier circuit 138 may also be integrated into a subtractor amplifier circuit. The signal amplified by the amplifier circuit 138 is input to a second AD conversion circuit 142 and a second sample-and-hold circuit 144. The second AD conversion circuit 144 converts the value of the input analog signal into the digital value of two bits for output. A second DA conversion circuit 140 converts the digital value output by the second AD conversion circuit 142 into an analog value. The output from the second DA conversion circuit 140 is input to the subtractor circuit 136 through a fourth switch 134. The second sample-and-hold circuit 144, which samples and holds the input analog signal, has an amplification factor of two. The analog value held in the second sample-and-hold circuit 144 is input to the subtractor circuit 136 through a second switch 146. In the second and third steps, the subtractor circuit 136 outputs the difference between the analog value input by the second DA conversion circuit 140 and the analog value held in the second sample-and-hold circuit 144. The output from the subtractor circuit 136 is amplified in the amplifier circuit 138 for feedback to the second sample-and-hold circuit 144 and the second AD conversion circuit 142.

The amplifier circuit 138 performs the feedback-based cyclic processing three times. When the first AD conversion circuit 124 performs an AD conversion in the first and fourths steps, the third switch 130 and the first switch 132 are turned on while the fourth switch 134 and the second switch 146 are turned off. Thereafter, when the second AD conversion circuit 142 performs an AD conversion in the second and third steps, the third switch 130 and the first switch 132 are turned off while the fourth switch 134 and the second switch 146 are turned on. The digital values output by the second AD conversion circuit 142 during circulation are those of the fifth and sixth bits (D5 and D4), the seventh and eighth bits (D3 and D2), and the ninth and tenth bits (D1 and D0) from the most significant bit in the digital value eventually output by the AD converter 120. In this manner, the higher-order four bits of the 10 bits are converted by means of the first AD conversion circuit 124 in the first step, while the lower-order six bits are converted by the second AD conversion circuit 142 in the second to fourth steps. The second AD conversion circuit 142 has a processing speed setting three times higher than that of the first AD conversion circuit 124. Thus, the first AD conversion circuit 124 and the second AD conversion circuit 142 perform different amounts of processing but require the same amount of time for conversion. It is thus possible for the first AD conversion circuit 124 and the second AD conversion circuit 142 to perform simultaneous processing in parallel.

Figure 8:
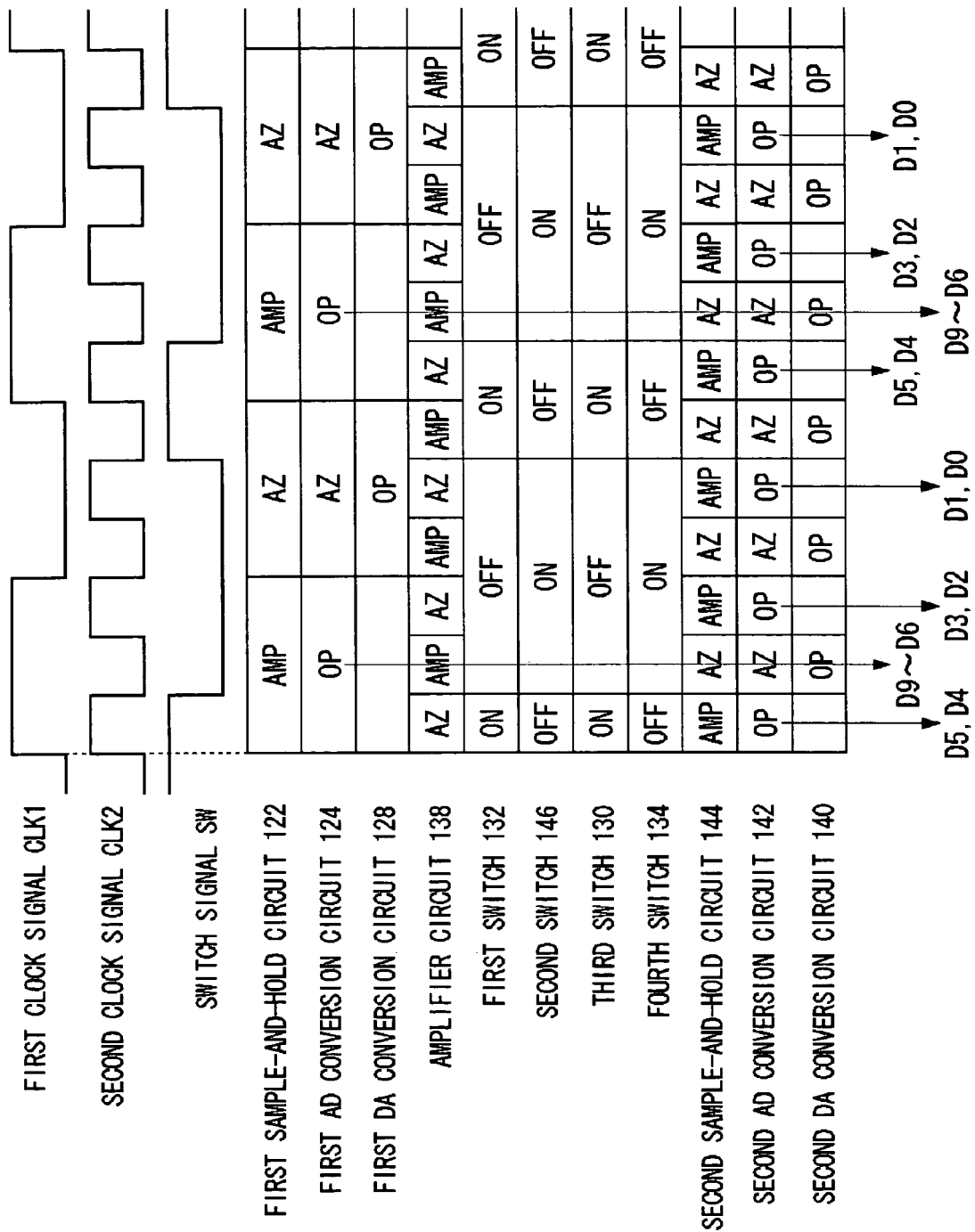
FIG. 8 is a time chart showing the operation process of an AD converter.
Figure 9:
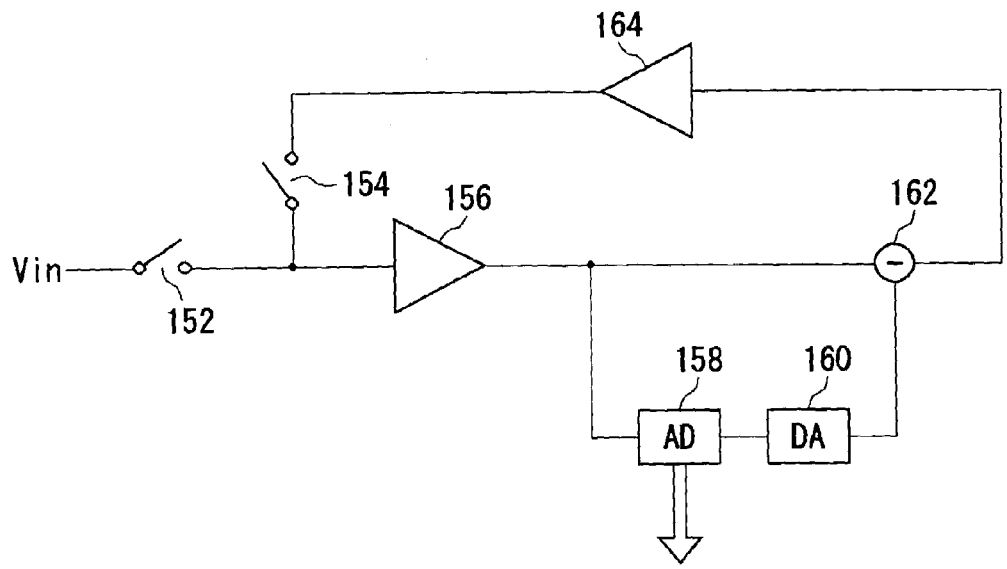
FIG. 9 is a view showing the configuration of a conventional cyclic AD converter.

FIG. 8 is a time chart showing the operation process of the AD converter 120. Now, an explanation of the chart will be given step by step starting at the top. The three signal waveforms indicate a first clock signal CLK1, a second clock signal CLK2, and a switch signal SW. The first clock signal CLK1 controls the operation of the first sample-and-hold circuit 122, the first AD conversion circuit 124, and the second DA conversion circuit 128. The second clock signal CLK2 controls the operation of the second DA conversion circuit 140, the second AD conversion circuit 142, the second sample-and-hold circuit 144, and the amplifier circuit 138. The switch signal SW controls on/off status of the first switch 132 and the third switch 130, while its inverted signal controls on/off status of the second switch 146 and the fourth switch 134.

The first clock signal CLK1 and the second clock signal CLK2 have the same cycle, frequency, and waveform as those of the first clock signal CLK1 and the second clock signal CLK2 of the first to third embodiments. That is, since the second clock signal CLK2 has a frequency three times higher than that of the first clock signal CLK1, the second AD conversion circuit 142 performs conversions in the second to fourth steps threes times faster than the first AD conversion circuit 124 in the first step. The switch signal SW has the same cycle, frequency, and waveform as those of the first switch signal SW1 in the first to third embodiments.

The operation timing of the first sample-and-hold circuit 122, the first AD conversion circuit 124, and the second DA conversion circuit 128 is the same as that of the first sample-and-hold circuit 42, the first AD conversion circuit 44, and the first DA conversion circuit 46, respectively. On the other hand, the amplifier circuit 138 amplifies the input analog signal when the second clock signal CLK2 is low, and performs an auto-zero operation when the second clock signal CLK2 is high. However, the amplifier circuit 138 amplifies the output from the subtractor circuit 136 in the first step when the second clock signal CLK2 is low in the fourth step.

The operation timing of the first switch 132 and the second switch 146 is the same as that of the first switch 18 and the second switch 20 of the first embodiment, respectively. Likewise, the operation timing of the third switch 130 and the fourth switch 134 is the same as that of the first switch 18 and the second switch 20 of the first embodiment, respectively. The operation timing of the second sample-and-hold circuit 144 and the second AD conversion circuit 142 is the same as that of the second sample-and-hold circuit 58 and the second AD conversion circuit 60 of the second embodiment, respectively. On the other hand, the second DA conversion circuit 140 performs a DA conversion in the second and third steps when the second clock signal CLK2 is low, and becomes floating when the second clock signal CLK2 is high.

As shown, while the second AD conversion circuit 142 performs conversions of D5 to D0, the first AD conversion circuit 124 concurrently performs a conversion of an input analog signal Vin subsequently supplied. This pipelined processing makes it possible for the entire AD converter 120 to output a digital value of 10 bits once in a cycle with respect to the first clock signal CLK1. In the fourth step, immediately after the second AD conversion circuit 142 has output D1 and D0, the subtractor circuit 136 and the amplifier circuit 138 need not to perform a subtraction and an amplification on the output provided by the second DA conversion circuit 140, thus being used with that timing for a subtraction and an amplification in the first step for the subsequent input analog signal Vin.

As described above, this embodiment allows the first AD conversion circuit 124 to perform the first step AD conversion, and then allows the cyclic circuits mainly of the second AD conversion circuit 142 to perform the remaining second to fourth steps sequentially. This allows the pipelined processing to be performed in the first and subsequent steps. In the second and third steps, the subtractor circuit 136 and the amplifier circuit 138 output and amplify the difference between the value held in the second sample-and-hold circuit 144 and the value output by the second DA conversion circuit 140. However, the subtractor circuit 136 and the amplifier circuit 138 need not to perform a subtraction and an amplification on the output delivered by the second DA conversion circuit 140 in the fourth step, thus being used with that timing for a subtraction and an amplification in the first step for the subsequent input analog signal Vin. Accordingly, it is possible to improve the processing speed for an analog-to-digital conversion and make effective use of the subtractor circuit and the amplifier circuit while preventing an increase in circuit area.

Up to this point, the first to fourth embodiments of the present invention has been described. These embodiments are given solely by way of illustration. It will be understood by those skilled in the art that various modified examples may be made of combinations of the foregoing components and processes, and all such modified examples are also intended to fall within the scope of the present invention. The following provides some of the modified examples of the first to fourth embodiments.

The AD converter 10 of the first embodiment includes two AD conversion circuits, one DA conversion circuit, one subtractor circuit, and one amplifier circuit. In a modified example, three AD conversion circuits may also be employed, in the case of which the AD converter designed under the concept of the first embodiment can include the DA conversion circuit, the subtractor circuit, and the amplifier circuit that are each less in number than the AD conversion circuit.

The parameters described in the first to fourth embodiments, such as the number of converted bits and allocation in the AD conversion circuit, the amplification factor of the amplifier circuit, the frequency of clocks, and the conversion speed, have been provided only by way of example. In a modified example, other numerical values may also be employed in addition to these parameters.

(Second Group)

(Fifth Embodiment)

Figure 10:
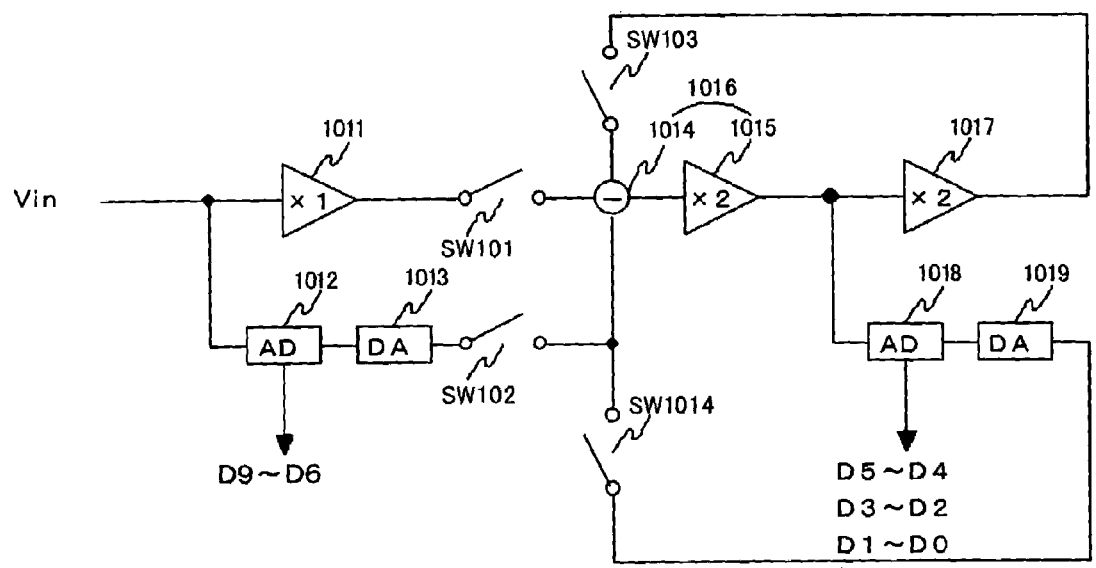
FIG. 10 is a view showing the configuration of a pipelined AD converter including a cyclic AD conversion portion according to a fifth embodiment.

FIG. 10 shows the configuration of a pipelined AD converter including a cyclic AD conversion portion according to a fifth embodiment. This embodiment is an example in which a conversion is performed on a total of 10 bits. A first amplifier circuit 1011, a first AD conversion circuit 1012, a first DA conversion circuit 1013, a subtractor circuit 1014, and a second amplifier circuit 1015 constitute the first stage. A third amplifier circuit 1017, a second AD conversion circuit 1018, and a second DA conversion circuit constitute the second stage. The second stage utilizes the subtractor circuit 1014 and the second amplifier circuit 1015 of the first stage.

In the initial state, a first switch SW101 and a second switch SW102 are turned on, while a third switch SW103 and a fourth switch SW104 are turned off. An input analog signal Vin is supplied to the first amplifier circuit 1011 and the first AD conversion circuit 1012. The first AD conversion circuit 1012 converts the input analog signal into a digital value of four bits, or higher-order four bits (D9-D6) of the 10 bits, for output to an encoder (not shown). The first DA conversion circuit 1013 converts the digital value of four bits output by the first AD conversion circuit 1012 into an analog signal. The resulting analog signal is output with the predetermined timing to the subtractor circuit 1014 through the second switch SW102. The first amplifier circuit 1011 samples and holds the input analog signal Vin for output to the subtractor circuit 1014 through the first switch SW101 with the predetermined timing. The subtractor circuit 1014 subtracts the output of the first DA conversion circuit 1013 from the output of the first amplifier circuit 1011. This allows for producing an analog signal with the four higher-order bit components having been removed. The second amplifier circuit 1015 amplifies the output from the subtractor circuit 1014 with an amplification factor of two. The amplified output is delivered to the third amplifier circuit 1017 and the second AD conversion circuit 1018. Instead of the subtractor circuit 1014 and the second amplifier circuit 1015, it is also acceptable to employ a subtractor amplifier circuit 1016 into which their functions are integrated.

In this step, the first switch SW101 and the second switch SW102 are turned off, while the third switch SW103 and the fourth switch SW104 are turned on. The second AD conversion circuit 1018 converts the input analog signal into a digital value of two bits, or the fifth and sixth bits (D5 and D4) from the most significant bit of the 10 bits, for output to an encoder (not shown). One redundant bit may also be added thereto to convert every three bits.

The first AD conversion circuit 1012 and the second AD conversion circuit 1018 are provided with a plurality of voltage comparison elements. Each of the voltage comparison elements is supplied with a reference voltage for each voltage VA (V) corresponding to the LSB (the least significant bit) (hereinafter referred to as a LSB voltage) of their converter circuits. In the absence of the second amplifier circuit 1015, the second AD conversion circuit 1018 performs a conversion of two bits and thus needs to be provided with an LSB voltage that is one fourth (2 to the power of 2) that of the first AD conversion circuit 1012. In this embodiment, since the second amplifier circuit 1015 amplifies the output from the first AD conversion circuit 1012 by a factor of two for output to the second AD conversion circuit 1018, the LSB voltage of the second AD conversion circuit 1018 is set to half that of the first AD conversion circuit 1012.

The second DA conversion circuit 1019 converts the digital value of two bits output by the second AD conversion circuit 1018 into an analog signal. The resulting analog signal is output to the subtractor circuit 1014 through the fourth switch SW104. The output from the second DA conversion circuit 1019 has been amplified by a factor of two.

Now, a technique for amplifying the output from the second DA conversion circuit 1019 by a factor of two will be briefly explained below. The second AD conversion circuit 1018 and the second DA conversion circuit 1019 are supplied with a high-voltage side reference voltage VRT and a low-voltage side reference voltage VRB. The second AD conversion circuit 1018 produces a reference voltage using a reference voltage range that is produced in accordance with the high-voltage side reference voltage VRT and the low-voltage side reference voltage VRB. For a capacitor array based DA conversion, the second DA conversion circuit 1019 obtains an output voltage by selectively supplying the high-voltage side reference voltage VRT and the low-voltage side reference voltage VRB to each of a plurality of arrayed capacitors (not shown) under the control of the second AD conversion circuit 1018. The reference voltage range of the second DA conversion circuit 1019 is also produced in accordance with the high-voltage side reference voltage VRT and the low-voltage side reference voltage VRB. At this time, the ratio between the reference voltage range of the second AD conversion circuit 1018 and that of the second DA conversion circuit 1019 may be set to 1:2.

The third amplifier circuit 1017 amplifies the input analog signal by a factor of two for output to the subtractor circuit 1014 through the third switch SW103. The subtractor circuit 1014 subtracts the output of the second DA conversion circuit 1019 from the output of the third amplifier circuit 1017. This allows for producing an analog signal with the six higher-order bit components having been removed. The second amplifier circuit 1015 amplifies the output from the subtractor circuit 1014 with an amplification factor of two. The amplified output is delivered to the third amplifier circuit 1017 and the second AD conversion circuit 1018.

The second AD conversion circuit 1018 converts again the input analog signal into a digital value of two bits, or the seventh and eighth bits (D3 and D2) from the most significant bit of the 10 bits, for output to an encoder. (not shown). Since the second AD conversion circuit 1018 performs a conversion of two bits, the input analog signal needs to be substantially four times (2 to the power of 2) with respect to the previous conversion. In this embodiment, since the third amplifier circuit 1017 and the second amplifier circuit 1015 amplify an input analog signal each by a factor of two, the input analog signal has been substantially four times. Then, the second AD conversion circuit 1018 performs a conversion of the ninth and tenth bits (D1 and D0) from the most significant bit in the same process as that for a conversion of the seventh and eighth bits (D3 and D2) from the most significant bit. In this manner, the first AD conversion circuit 1012 of the first stage performs a conversion of the values of the first to fourth bits (D9 to D6) from the most significant bit in the 10 bits that require a relatively high accuracy, while the second AD conversion circuit 1018 of the second stage performs cyclic conversions in three steps on the values of the fifth to tenth bits (D5 to D0) from the most significant bit in the 10 bits.

Figure 11:
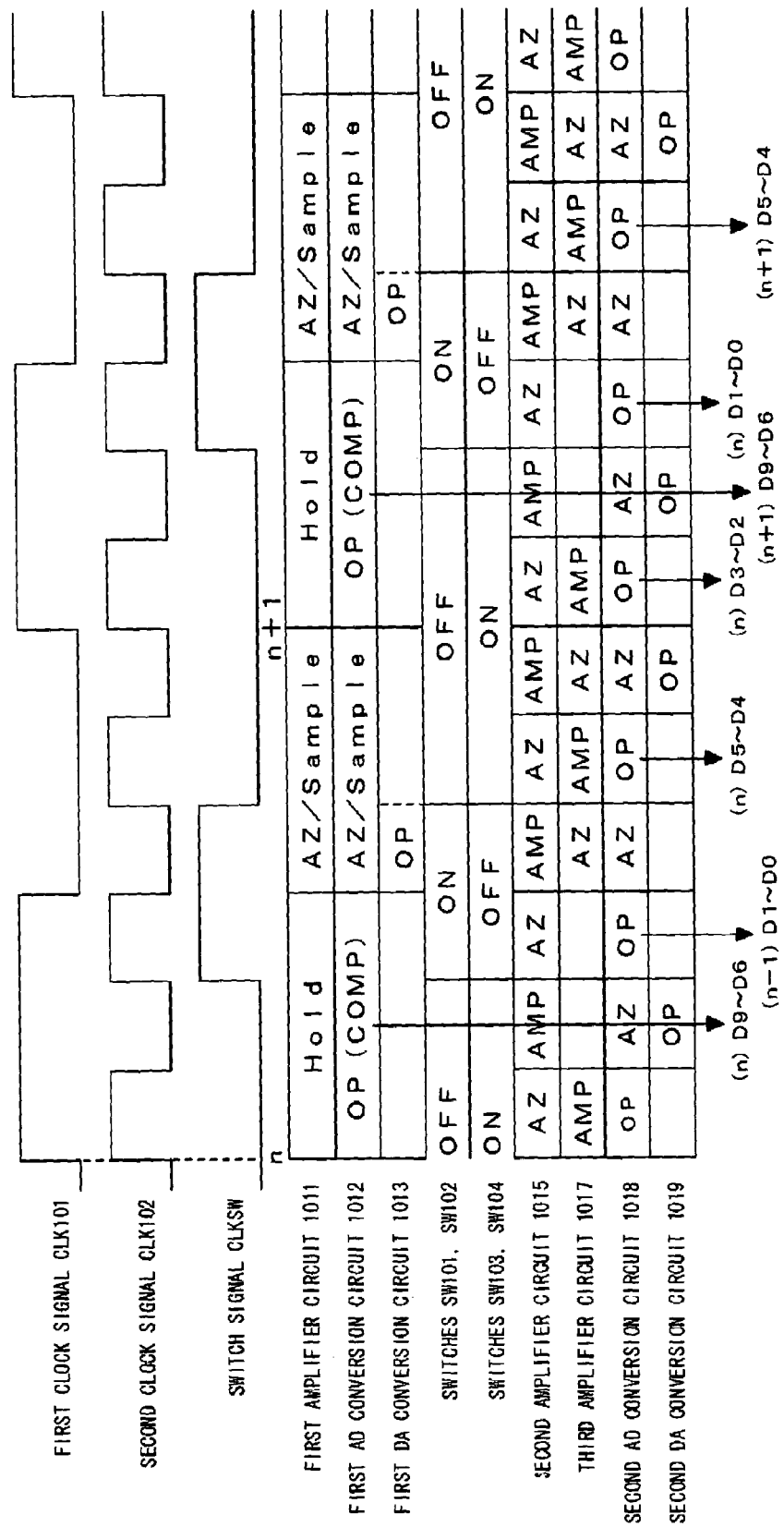
FIG. 11 is a time chart showing the operation process of the AD converter according to the fifth embodiment.

FIG. 11 is a time chart showing the operation process of the AD converter according to the fifth embodiment. Now, an explanation of the chart will be given step by step starting at the top. The three signal waveforms indicate a first clock signal CLK101, a second clock signal CLK102, and a switch signal CLKSW. The first clock signal CLK101 controls the operation of the first amplifier circuit 1011, the first AD conversion circuit 1012, and the first DA conversion circuit 1013. The second clock signal CLK102 controls the operation of the second amplifier circuit 1015, the third amplifier circuit 1017, the second AD conversion circuit 1018, and the second DA conversion circuit 1019. The switch signal CLKSW controls on/off status of the first switch SW101 and the second switch SW102 which operate synchronously. The inverted signal of the switch signal CLKSW controls on/off status of the third switch SW103 and the fourth switch SW104 which operate synchronously.

The second clock signal CLK102 has a frequency three times higher than that of the first clock signal CLK101. The second clock signal CLK102 may be produced through a multiplication using a PLL or the like based on the first clock signal CLK101. The second clock signal CLK102 has a rising edge synchronized with that of the first clock signal CLK101, the subsequent second falling edge synchronized with the subsequent falling edge of the first clock signal CLK101, and the further subsequent second rising edge synchronized with the subsequent rising edge of the first clock signal CLK101. The frequency of the second clock signal CLK102 three times higher than that of the first clock signal CLK101 will cause the conversion in the second stage to be performed three times faster than in the first stage. However, since the accuracy of analog processing such as a subtraction or an amplification for conversions of higher-order bits greatly contributes to the entire conversion accuracy, the first stage in charge of the processing is required for a higher accuracy. Accordingly, in the arrangement of this embodiment, the second stage that is not required for a higher processing accuracy than the first stage can perform conversions faster than the first stage.

The first amplifier circuit 1011 samples the input analog signal Vin at the rising edge of the first clock signal CLK101 and then holds the signal for the duration of Hi. The first amplifier circuit 1011 performs an auto-zero operation when the first clock signal CLK101 is Lo. The first AD conversion circuit 1012 performs a conversion to output digital values D9 to D6 when the first clock signal CLK101 is Hi, and performs an auto-zero operation when the first clock signal CLK101 is Lo. The first DA conversion circuit 1013 holds the converted definite data when the first clock signal CLK101 is Lo, and becomes floating when the first clock signal CLK101 is Hi. The converted definite data may be held only during an earlier part of the Lo duration of the first clock signal CLK101.

The first and second switches SW101, SW102 are turned on when the switch signal CLKSW is Hi, and turned off when the switch signal CLKSW is Lo. The third and fourth switches SW103, SW104 are turned on when the switch signal CLKSW is Lo, and turned off when the switch signal CLKSW is Hi. The second amplifier circuit 1015 performs a subtraction and an amplification on the input analog signal when the second clock signal CLK102 is Lo, and performs an auto-zero operation when the second clock signal CLK102 is Hi. The second amplifier circuit 1015, or a constituent element of the first stage which is controlled originally by the first clock signal CLK, is utilized for a conversion in the second stage in this embodiment, thus being controlled by the second clock signal CLK102. The third amplifier circuit 1017 amplifies the output from the second amplifier circuit 1015 when the second clock signal CLK102 is Hi, and performs an auto-zero operation when the second clock signal CLK102 is Lo. No amplification is carried out during the D1 and D0 being converted by the second AD conversion circuit 1018. The second AD conversion circuit 1018 performs a conversion when the second clock signal CLK102 is Hi, and performs an auto-zero operation when the second clock signal CLK102 is Lo. The second DA conversion circuit 1019 holds the converted definite data when the second clock signal CLK102 is Lo, and becomes floating when the second clock signal CLK102 is Hi. No conversion is carried out after the second AD conversion circuit 1018 has performed the conversion of outputs D1 and D0. During the auto-zero operation of the first amplifier circuit 1011, the second amplifier circuit 1015, the third amplifier circuit 1017, the first AD conversion circuit 1012, and the second AD conversion circuit 1018, an input signal is being sampled. The first amplifier circuit 1011 and the first AD conversion circuit 1012 sample an input analog signal at the rising edge of the first clock signal CLK101. The second amplifier circuit 1015 samples an input analog signal at the falling edge of the second clock signal CLK102. The third amplifier circuit 1017 and the second AD conversion circuit 1018 sample an input analog signal at the rising edge of the second clock signal CLK102. The third amplifier circuit 1017 performs no sampling once in three times.

As shown, while the second AD conversion circuit 1018 performs conversions of D3 and D2, and D1 and D0, the first AD conversion circuit 1012 concurrently performs a conversion of an input analog signal Vin subsequently supplied. This pipelined processing makes it possible for the entire AD converter to output a digital value of 10 bits once in a cycle with respect to the first clock signal CLK101.

As described above, this embodiment allows the cyclic second stage to employ the subtractor circuit 1014 and the second amplifier circuit 1015 of the fist stage for an AD conversion. This eliminates the need of providing these components, thereby realizing a reduced circuit area. When compared with the case where the subtractor circuit 1014 and the second amplifier circuit 1015 are not shared in the first and second stages but provided also in the second stage, this embodiment provides the same conversion speed. Accordingly, it is possible to realize a reduced circuit area without any change in conversion speed.

(Sixth Embodiment)

Figure 12:
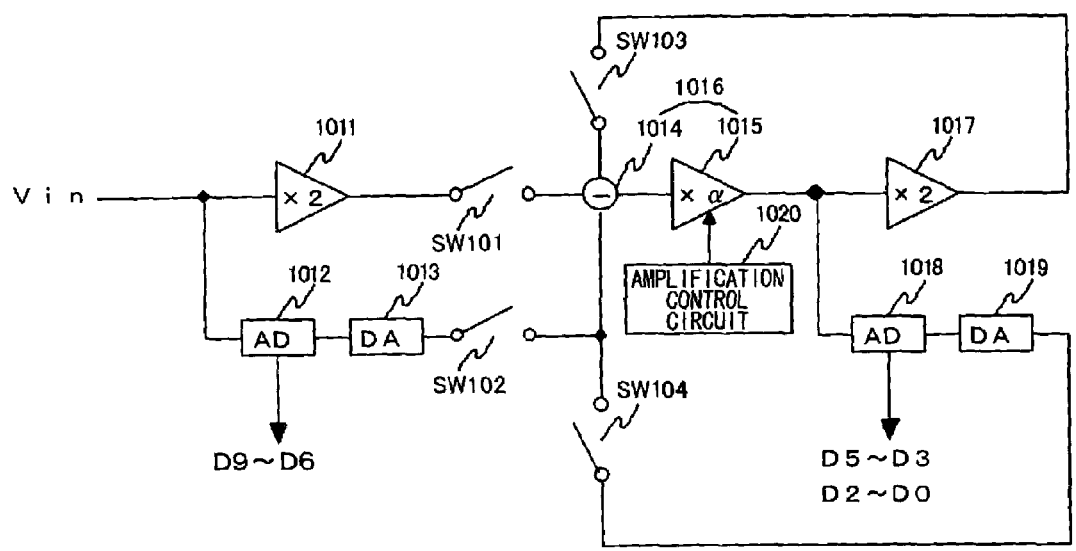
FIG. 12 is a view showing the configuration of a pipelined AD converter including a cyclic AD conversion portion according to a sixth embodiment.

FIG. 12 shows the configuration of a pipelined AD converter including a cyclic AD conversion portion according to a sixth embodiment. This embodiment is an example in which a conversion is performed on a total of 10 bits. The first amplifier circuit 1011, the first AD conversion circuit 1012, the first DA conversion circuit 1013, the subtractor circuit 1014, and the second amplifier circuit 1015 constitute the first stage. The third amplifier circuit 1017, the second AD conversion circuit 1018, and the second DA conversion circuit constitute the second stage. The second stage utilizes the subtractor circuit 1014 and the second amplifier circuit 1015 of the first stage. The amplification factor of the second amplifier circuit 1015 is variable and set to a factor of two upon conversion in the first stage in consideration of accuracy. For a conversion of three bits in the second stage, the factor is set to four to sum to a total amplification factor of eight.

In the initial state, the first switch SW101 and the second switch SW102 are in an on position, while the third switch SW103 and the fourth switch SW104 are in an off position. The second amplifier circuit 1015 has an amplification factor of two. An input analog signal Vin is supplied to the first amplifier circuit 1011 and the first AD conversion circuit 1012. The first AD conversion circuit 1012 converts the input analog signal into a digital value of four bits, or higher-order four bits (D9-D6) of the 10 bits, for output to an encoder (not shown). The first DA conversion circuit 1013 converts the digital value of four bits output by the first AD conversion circuit 1012 into an analog signal. The resulting analog signal is output with the predetermined timing to the subtractor circuit 1014 through the second switch SW102. The first amplifier circuit 1011 amplifies the input analog signal Vin by a factor of two for output to the subtractor circuit 1014 through the first switch SW101 with the predetermined timing. The subtractor circuit 1014 subtracts the output of the first DA conversion circuit 1013 from the output of the first amplifier circuit 1011. This allows for producing an analog signal with the four higher-order bit components having been removed. Here, the output from the first DA conversion circuit 1013 has been doubled. The second amplifier circuit 1015 amplifies the output from the subtractor circuit 1014 with an amplification factor of two for output to the third amplifier circuit 1017 and the second AD conversion circuit 1018. An amplification control circuit 1020 controls the amplification factor of the second amplifier circuit 1015, which is set to two in the initial step. Instead of the subtractor circuit 1014 and the second amplifier circuit 1015, it is also acceptable to employ the subtractor amplifier circuit 1016 into which their functions are integrated.

In this step, the first switch SW101 and the second switch SW102 are turned off, while the third switch SW103 and the fourth switch SW104 are turned on. The amplification control circuit 1020 changes the amplification factor of the second amplifier circuit 1015 into four. The second AD conversion circuit 1018 converts the input analog signal into a digital value of three bits, or the fifth to seventh bits (D5 to D3) from the most significant bit of the 10 bits, for output to an encoder (not shown). One redundant bit may also be added thereto for a conversion being performed every four bits.

The second AD conversion circuit 1018 performs a conversion of three bits and thus if no amplification is available, then needs to be provided with a LSB voltage that is one eighth (2 to the power of 3) that of the first AD conversion circuit 1012. In this embodiment, since a total amplification factor of four is provided, i.e., one factor of two by the first amplifier circuit 1011 and the other factor of two by the second amplifier circuit 1015, the LSB voltage of the second AD conversion circuit 1018 is set to half that of the first AD conversion circuit 1012.

The second DA conversion circuit 1019 converts the digital value of three bits output by the second AD conversion circuit 1018 into an analog signal. The resulting analog signal is output to the subtractor circuit 1014 through the fourth switch SW104. The output from the second DA conversion circuit 1019 has been amplified by a factor of two.

The third amplifier circuit 1017 amplifies the input analog signal by a factor of two for output to the subtractor circuit 1014 through the third switch SW103. The subtractor circuit 1014 subtracts the output of the second DA conversion circuit 1019 from the output of the third amplifier circuit 1017. This allows for producing an analog signal with the seven higher-order bit components having been removed. The second amplifier circuit 1015 amplifies the output from the subtractor circuit 1014 with an amplification factor of four. The amplified output is delivered to the third amplifier circuit 1017 and the second AD conversion circuit 1018.

The second AD conversion circuit 1018 converts again the input analog signal into a digital value of three bits, or the eighth to tenth bits (D2 to D0) from the most significant bit of the 10 bits, for output to an encoder (not shown). Since the second AD conversion circuit 1018 performs a conversion of three bits, the input analog signal needs to be substantially eight times (2 to the power of 3) with respect to the previous conversion. In this embodiment, since the third amplifier circuit 1017 and the second amplifier circuit 1015 amplify an input analog signal by a factor of two and four, respectively, the input analog signal has been substantially eight times. In this manner, the first AD conversion circuit 1012 of the first stage performs a conversion of the values of the first to fourth bits (D9 to D6) from the most significant bit in the 10 bits that require a relatively high accuracy, while the second AD conversion circuit 1018 of the second stage performs cyclic conversions in two steps on the values of the fifth to tenth bits (D5 to D0) from the most significant bit in the 10 bits.

Figure 13:
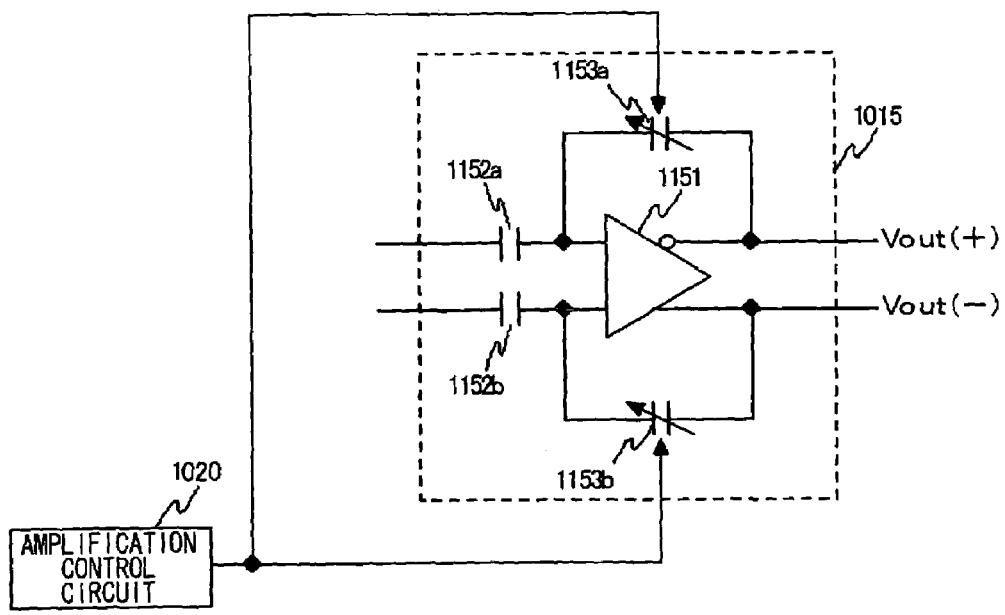
FIG. 13 is a detailed view showing the configuration of an amplification control circuit and a second amplifier circuit.

FIG. 13 shows a detailed configuration of the amplification control circuit 1020 and the second amplifier circuit 1015. The second amplifier circuit 1015 is a full differential amplifier circuit, with both input and output being provided as a difference between two terminal voltages, mainly including an operational amplifier 1151, first capacitors

1152*a*, 1152*b*, and second capacitors 1153*a*, 1153*b*. The first capacitors 1152*a*, 1152*b*, located on the input side of the operational amplifier 1151, have a fixed capacitance. The second capacitors 1153*a*, 1153*b*, disposed between the input and output of the operational amplifier 1151, have a variable capacitance. The variability of the capacitance can provide variable feedback constants. The capacitance of the second capacitors 1153*a*, 1153*b* is switched by means of an amplification switching signal output by the amplification control circuit 1020. Assuming that C101 is the capacitance of the first capacitors 1152*a*, 1152*b*, and C102 is the capacitance of the second capacitors 1153*a*, 1153*b*, the amplification factor of the second amplifier circuit 1015 is given by C101/C102. This embodiment is configured such that two values can be set as the capacitance of the second capacitors 1153*a*, 1153*b* because the amplification factor of the second amplifier circuit 1015 is switched between two and four. For example, the second capacitors 1153*a*, 1153*b* may be formed of two capacitors having the same capacitance which are connected in parallel to each other through a switch. In this case, for the switch to select the number of connections of the capacitors, the amplification switching signal controls on/off status of the switch. Although the aforementioned second capacitors 1153*a*, 1153*b* are variable, it is also acceptable to make the first capacitors 1152*a*, 1152*b* variable.

Figure 14:
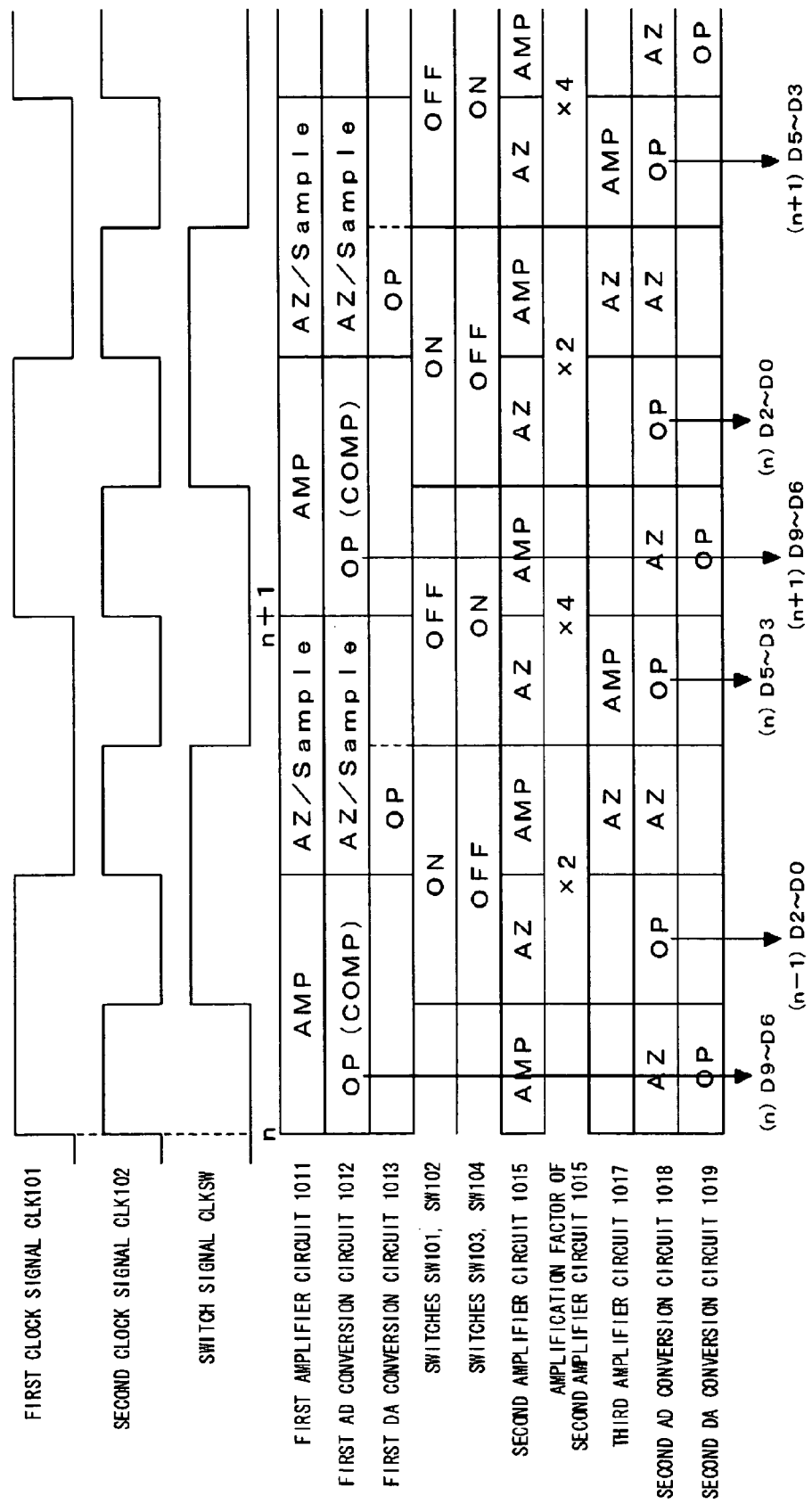
FIG. 14 is a time chart showing the operation process of an AD converter according to the sixth embodiment.

FIG. 14 is a time chart showing the operation process of the AD converter according to the sixth embodiment. Now, an explanation of the chart will be given step by step starting at the top. The three signal waveforms indicate a first clock signal CLK101, a second clock signal CLK102, and a switch signal CLKSW. The first clock signal CLK101 controls the operation of the first amplifier circuit 1011, the first AD conversion circuit 1012, and the first DA conversion circuit 1013. The second clock signal CLK102 controls the operation of the second amplifier circuit 1015, the third amplifier circuit 1017, the second AD conversion circuit 1018, and the second DA conversion circuit 1019. The switch signal CLKSW controls on/off status of the first switch SW101 and the second switch SW102 which operate synchronously. The inverted signal of the switch signal CLKSW controls on/off status of the third switch SW103 and the fourth switch SW104 which operate synchronously.

The second clock signal CLK102 has a frequency two times higher than that of the first clock signal CLK101. The frequency of the second clock signal CLK102 two times higher than that of the first clock signal CLK101 will cause the conversion in the second stage to be performed two times faster than in the first stage. However, since the accuracy of analog processing such as a subtraction or an amplification for conversions of higher-order bits greatly contributes to the entire conversion accuracy, the first stage in charge of the processing is required for a higher accuracy. Accordingly, in the arrangement of this embodiment, the second stage that is not required for a higher processing accuracy than the first stage can perform conversions faster than the first stage.

The first amplifier circuit 1011 samples the input analog signal Vin at the rising edge of the first clock signal CLK101 and then holds the signal for the duration of Hi. The first amplifier circuit 1011 performs an auto-zero operation when the first clock signal CLK101 is Lo. The first AD conversion circuit 1012 performs a conversion to output digital values D9 to D6 when the first clock signal CLK101 is Hi, and performs an auto-zero operation when the first clock signal CLK101 is Lo. The first DA conversion circuit 1013 holds the converted definite data when the first clock signal CLK101 is Lo, and becomes floating when the first clock signal CLK101 is Hi. The converted definite data may be held only during an earlier part of the Lo duration of the first clock signal CLK101.

The first and second switches SW101, SW102 are turned on when the switch signal CLKSW is Hi, and turned off when the switch signal CLKSW is Lo. The third and fourth switches SW103, SW104 are turned on when the switch signal CLKSW is Lo, and turned off when the switch signal CLKSW is Hi. The second amplifier circuit 1015 performs a subtraction and an amplification on the supplied analog signal when the second clock signal CLK102 is Hi, and performs an auto-zero operation when the second clock signal CLK102 is Lo. The second amplifier circuit 1015, or a constituent element of the first stage which is controlled originally by the first clock signal CLK, is utilized for a conversion in the second stage in this embodiment, thus being controlled by the second clock signal CLK102. The amplification control circuit 1020 controls the second amplifier circuit 1015 to have an amplification factor of two when the switch signal CLKSW is Hi and four when the switch signal CLKSW is Lo. The third amplifier circuit 1017 amplifies the output from the second amplifier circuit 1015 when the second clock signal CLK102 is Lo, and performs an auto-zero operation when the second clock signal CLK102 is Hi. No amplification is carried out during the D2 to D0 being converted by the second AD conversion circuit 1018. The second AD conversion circuit 1018 performs a conversion when the second clock signal CLK102 is Lo, and performs an auto-zero operation when the second clock signal CLK102 is Hi. The second DA conversion circuit 1019 holds the converted definite data when the second clock signal CLK102 is Hi, and becomes floating when the second clock signal CLK102 is Lo. No conversion is carried out after the second AD conversion circuit 1018 has performed the conversion of outputs D2 to D0. During the auto-zero operation of the first amplifier circuit 1011, the second amplifier circuit 1015, the third amplifier circuit 1017, the first AD conversion circuit 1012, and the second AD conversion circuit 1018, an input signal is being sampled. The first amplifier circuit 1011 and the first AD conversion circuit 1012 sample an input signal at the rising edge of the first clock signal CLK101. The second amplifier circuit 1015 samples an input signal at the rising edge of the second clock signal CLK102. The third amplifier circuit 1017 and the second AD conversion circuit 1018 sample an input signal at the falling edge of the second clock signal CLK102. The third amplifier circuit 1017 performs sampling alternately.

As shown, while the second AD conversion circuit 1018 performs conversions of D2 to D0, the first AD conversion circuit 1012 concurrently performs a conversion of an input analog signal Vin subsequently supplied. This pipelined processing makes it possible for the entire AD converter to output a digital value of 10 bits once in a cycle with respect to the first clock signal CLK101.

As described above, this embodiment allows the cyclic second stage to employ the subtractor circuit 1014 and the second amplifier circuit 1015 of the first stage for an AD conversion. This eliminates the need of providing these components, thereby realizing a reduced circuit area. Furthermore, the second amplifier circuit can be shared even when the amplification factor of the second amplifier circuit 1015 being utilized in the first stage is different from that of the second amplifier circuit 1015 being utilized in the second stage. This embodiment employs the amplification factor in the first stage being less than that in the second stage, thereby enabling the entire AD converter to operate faster when compared with the case of the amplification factors being the same. This is realized by the first amplifier circuit 1011 also performing an amplification by a factor of two.

Up to this point, the present invention has been described in conjunction with the fifth and sixth embodiments thereof. These embodiments are given solely by way of illustration. It will be understood by those skilled in the art that various modified examples may be made of combinations of the foregoing components and processes, and all such modified examples are also intended to fall within the scope of the present invention. The following provides some of the modified examples of the fifth and sixth embodiments.

Figure 15:
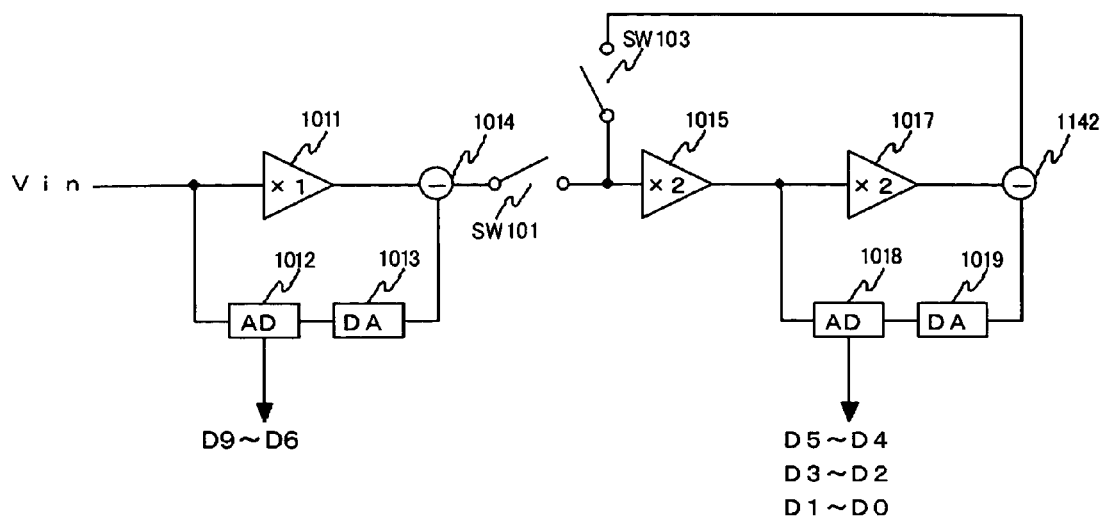
FIG. 15 is a view showing the configuration of an AD converter according to a first modified example.

The fifth embodiment described above is an example in which the subtractor circuit 1014 and the second amplifier circuit 1015 are shared. In this regard, it is also acceptable to share only the second amplifier circuit 1015. FIG. 15 shows the configuration of such an AD converter as a first modified example. The AD converter is provided with a subtractor circuit 1142 of the second stage for subtracting the output of the second DA conversion circuit 1019 from the output of the third amplifier circuit 1017. The first switch SW101 is interposed between the subtractor circuit 1014 and the second amplifier circuit 1015 in the first stage, with the third switch SW103 disposed between the subtractor circuit 1142 and the second amplifier circuit 1015 in the second stage. The second switch SW102 and the fourth switch SW104 are not required. The operation timing is the same as described in the fifth embodiment.

Figure 16:
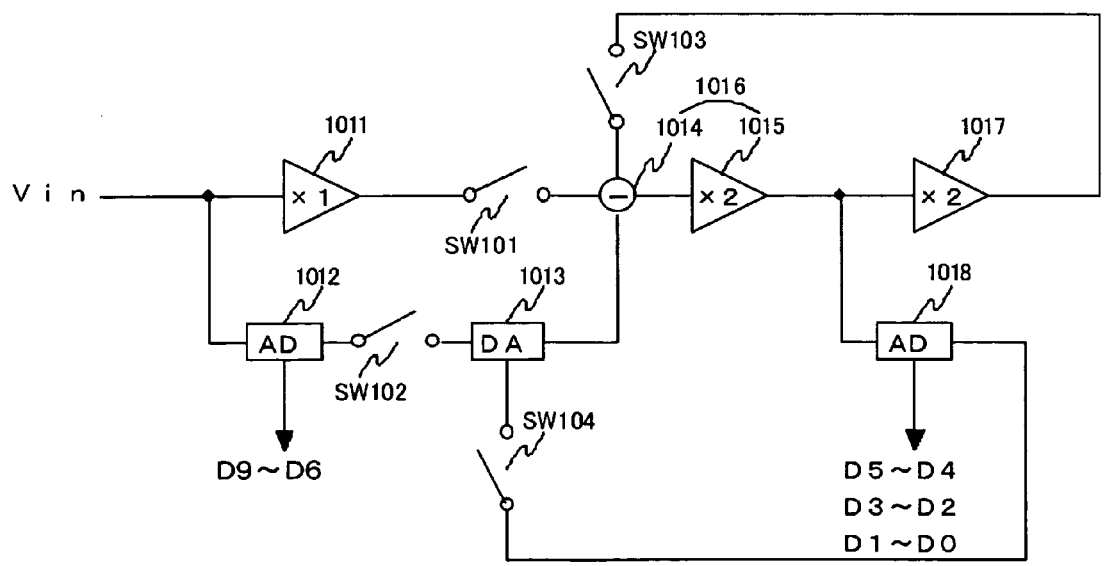
FIG. 16 is a view showing the configuration of an AD converter according to a second modified example.

Furthermore, it is additionally possible to share the first DA conversion circuit 1013 and the second DA conversion circuit 1019. FIG. 16 shows the configuration of such an AD converter as a second modified example. Referring to FIG. 16, the second DA conversion circuit 1019 of the second stage has been eliminated. The second switch SW102 is interposed between the first AD conversion circuit 1012 and the first DA conversion circuit 1013, with the fourth switch SW104 disposed between the second AD conversion circuit 1018 and the first DA conversion circuit 1013. The first DA conversion circuit 1013 and the second DA conversion circuit 1019 shown in the time charts of FIGS. 11 and 14 are integrated to be controlled by the second clock signal CLK102. This makes it possible to provide a further reduced circuit area while maintaining the conversion speed.

The parameters described in the fifth and sixth embodiments, such as the number of converted bits and allocation in the AD conversion circuit, the amplification factor of the amplifier circuit, and the capacitance, have been provided only by way of example. In a modified example, other numerical values may also be employed in addition to these parameters.

Furthermore, the operation timing of the AD converter described in the fifth and sixth embodiments is not limited to those shown in the time charts but may be set arbitrarily so long as each of the components is ensured to operate properly.

What is claimed is:

1. An analog-to-digital converter comprising:
    a plurality of AD conversion circuits which converts an input analog signal into a digital value of a predetermined number of bits;
    one or more DA conversion circuits, less in number than the plurality of AD conversion circuits, which converts the output of the plurality of AD conversion circuits into an analog signal;
    a subtractor circuit which subtracts the output of the one or more DA conversion circuits from the input analog signal; and
    an amplifier circuit which amplifies the output of the subtractor circuit for feedback to at least any one of the plurality of AD conversion circuits,
    wherein at least any one of the plurality of AD conversion circuits and at least any one of the one or more DA conversion circuits are repeatedly utilized for feedback-based cyclic processing.

2. An analog-to-digital converter comprising:
    a first AD conversion circuit which converts an input analog signal into a digital value of a predetermined number of bits;
    a DA conversion circuit which converts the output of the first AD conversion circuit into an analog signal;
    a subtractor circuit which subtracts the output of the DA conversion circuit from the input analog signal;
    an amplifier circuit which amplifies the output of the subtractor circuit for feedback; and
    a second AD conversion circuit which converts the output of the amplifier circuit into a digital value of a predetermined number of bits after the feedback,
    wherein the DA conversion circuit converts the output of the second AD conversion circuit into an analog signal after the feedback.

3. An analog-to-digital converter which performs an analog-to-digital conversion separately in multiple steps, comprising:
    an AD conversion circuit which converts an input analog signal into a digital value of a predetermined number of bits in at least any one of the multiple steps;
    a DA conversion circuit which converts the output of the AD conversion circuit into an analog signal;
    a subtractor circuit which subtracts the output of the DA conversion circuit from the input analog signal; and
    an amplifier circuit which amplifies the output of the subtractor circuit for feedback,
    wherein the amplifier circuit is also utilized for other processing in the final step of the multiple steps.

4. The analog-to-digital converter according to claim 3, wherein
    the amplifier circuit is utilized for processing a subsequently supplied input analog voltage in the final step of the plurality of steps.

5. The analog-to-digital converter according to claim 3, wherein
    the amplifier circuit is utilized as a comparator which compares a subsequently supplied input analog voltage with a reference voltage in the final step of the plurality of steps.

6. An analog-to-digital converter which performs an analog-to-digital conversion separately in multiple steps, comprising:
    an AD conversion circuit which converts an input analog signal into a digital value of a predetermined number of bits in at least any one of the multiple steps;
    a DA conversion circuit which converts the output of the AD conversion circuit into an analog signal;
    a subtractor circuit which subtracts the output of the DA conversion circuit from the input analog signal; and
    an amplifier circuit which amplifies the output of the subtractor circuit for feedback,
    wherein the subtractor circuit is also utilized for other processing in the final step of the multiple steps.

7. The analog-to-digital converter according to claim 6, wherein
    the subtractor circuit is also utilized for processing a subsequently supplied input analog voltage in the final step of the plurality of steps.

8. An analog-to-digital converter which performs an analog-to-digital conversion separately in multiple steps, comprising:
an AD conversion circuit which converts an input analog signal into a digital value of a predetermined number of bits in at least any one of the multiple steps;
a DA conversion circuit which converts the output of the AD conversion circuit into an analog signal;
a subtractor circuit which subtracts the output of the DA conversion circuit from the input analog signal; and
an amplifier circuit which amplifies the output from the subtractor circuit for feedback,
wherein the DA conversion circuit is also utilized for other processing in the final step of the multiple steps.

9. The analog-to-digital converter according to claim 8, wherein
the DA conversion circuit is also utilized for processing a subsequently supplied input analog voltage in the final step of the plurality of steps.

10. An analog-to-digital converter which has at least two or more stages, wherein
one of stages comprises:
a common subtractor circuit which selectively subtracts a signal obtained by converting a converted digital value of the self-stage into an analog value from an input analog signal of the self-stage or subtracts a signal obtained by converting a converted digital value of another stage into an analog value from an input analog signal of the another stage; and
a common amplifier circuit which amplifies the output of the common subtractor circuit with a predetermined amplification factor.

11. The analog-to-digital converter according to claim 10, wherein
the common subtractor circuit and the common amplifier circuit is an integrated subtractor amplifier circuit.

12. The analog-to-digital converter according to claim 10, further comprising an amplification control circuit which variably controls the amplification factor of the common amplifier circuit.

13. The analog-to-digital converter according to claim 10, wherein
any one of the two or more stages subtracts between a signal obtained by amplifying the input analog signal of the self-stage with a predetermined amplification factor and a signal, amplified with substantially the same amplification factor as the predetermined amplification factor, obtained by converting a converted digital value of the self-stage into an analog value.

14. An analog-to-digital converter which has at least two or more stages, comprising:
a first AD conversion circuit which converts an input analog signal of a first stage into a digital value of a predetermined number of bits;
a first DA conversion circuit which converts the output of the first AD conversion circuit into an analog signal;
a second AD conversion circuit which converts an input analog signal of a second stage subsequent to the first stage into a digital value of a predetermined number of bits;
a second DA conversion circuit which converts the output of the second AD conversion circuit into an analog signal;
a common subtractor circuit which selectively subtracts the output signal of the first DA conversion circuit from the input analog signal of the first stage or subtracts the output signal of the second DA conversion circuit from the input analog signal of the second stage;
a common amplifier circuit which amplifies the output of the common subtractor circuit with a predetermined amplification factor;
a first stage switch which turns on or off the delivery of the input analog signal of the first stage and the delivery of the output signal of the first DA conversion circuit to the common subtractor circuit; and
a second stage switch which turns on or off the delivery of the input analog signal of the second stage and the delivery of the output signal of the second DA conversion circuit to the common subtractor circuit.

15. The analog-to-digital converter according to claim 14, wherein
the common subtractor circuit and the common amplifier circuit is an integrated subtractor amplifier circuit.

16. The analog-to-digital converter according to claim 14, further comprising an amplification control circuit which variably controls the amplification factor of the common amplifier circuit.

17. The analog-to-digital converter according to claim 14, wherein
any one of the two or more stages subtracts between a signal obtained by amplifying the input analog signal of the self-stage with a predetermined amplification factor and a signal, amplified with substantially the same amplification factor as the predetermined amplification factor, obtained by converting a converted digital value of the self-stage into an analog value.

18. An analog-to-digital converter which has at least two or more stages, wherein
one of the stages comprises:
a common DA conversion circuit which selectively converts a converted digital value of the self-stage or another stage into an analog signal;
a common subtractor circuit which selectively subtracts the output signal of the common DA conversion circuit obtained by converting the converted digital value of the self-stage from an input analog signal of the self-stage or subtracts the output signal of the common DA conversion circuit obtained by converting the converted digital value of the another stage from an input analog signal of the another stage; and
a common amplifier circuit which amplifies the output from the common subtractor circuit with a predetermined amplification factor.

19. The analog-to-digital converter according to claim 18, wherein
the common subtractor circuit and the common amplifier circuit is an integrated subtractor amplifier circuit.

20. The analog-to-digital converter according to claim 18, further comprising an amplification control circuit which variably controls the amplification factor of the common amplifier circuit.

21. The analog-to-digital converter according to claim 18, wherein
any one of the two or more stages subtracts between a signal obtained by amplifying the input analog signal of the self-stage with a predetermined amplification factor and a signal, amplified with substantially the same amplification factor as the predetermined amplification factor, obtained by converting a converted digital value of the self-stage into an analog value.

22. An analog-to-digital converter which has at least two or more stages, comprising:
- a first AD conversion circuit which converts an input analog signal of a first stage into a digital value of a predetermined number of bits;
- a second AD conversion circuit for converting an input analog signal of a second stage subsequent to the first stage into a digital value of a predetermined number of bits;
- a common DA conversion circuit which selectively converts the output of the first AD conversion circuit or the output of the second AD conversion circuit into an analog signal;
- a common subtractor circuit which selectively subtracts the output signal of the common DA conversion circuit obtained by converting the output of the first AD conversion circuit from the input analog signal of the first stage or subtracts the output signal of the common DA conversion circuit obtained by converting the output of the second AD conversion circuit from the input analog signal of the second stage;
- a common amplifier circuit which amplifies the output of the common subtractor circuit with a predetermined amplification factor;
- a first stage switch which turns on or off the delivery of the input analog signal of the first stage to the common subtractor circuit and the delivery of the output of the first AD conversion circuit to the common DA conversion circuit; and
- a second stage switch which turns on or off the delivery of the input analog signal of the second stage to the common subtractor circuit and the delivery of the output of the second AD conversion circuit to the common DA conversion circuit.

23. The analog-to-digital converter according to claim 22, wherein
the common subtractor circuit and the common amplifier circuit is an integrated subtractor amplifier circuit.

24. The analog-to-digital converter according to claim 22, further comprising an amplification control circuit which variably controls the amplification factor of the common amplifier circuit.

25. The analog-to-digital converter according to claim 22, wherein
any one of the two or more stages subtracts between a signal obtained by amplifying the input analog signal of the self-stage with a predetermined amplification factor and a signal, amplified with substantially the same amplification factor as the predetermined amplification factor, obtained by converting a converted digital value of the self-stage into an analog value.

26. An analog-to-digital converter which has at least two or more stages, wherein
one of the stages comprises a common amplifier circuit which selectively amplifies, with a predetermined amplification factor, a differential signal between an input analog signal of the self-stage and a signal obtained by converting a converted digital value of the self-stage into an analog value, or a differential signal between an analog signal of another stage and a signal obtained by converting a converted digital value of the another stage into an analog value.

27. The analog-to-digital converter according to claim 26, further comprising an amplification control circuit which variably controls the amplification factor of the common amplifier circuit.

28. The analog-to-digital converter according to claim 26, wherein
any one of the two or more stages subtracts between a signal obtained by amplifying the input analog signal of the self-stage with a predetermined amplification factor and a signal, amplified with substantially the same amplification factor as the predetermined amplification factor, obtained by converting a converted digital value of the self-stage into an analog value.

29. An analog-to-digital converter which has at least two or more stages, comprising:
- a first AD conversion circuit which converts an input analog signal of a first stage into a digital value of a predetermined number of bits;
- a first DA conversion circuit which converts the output of the first AD conversion circuit into an analog signal;
- a first subtractor circuit which subtracts an output signal of the first DA conversion circuit from the input analog signal of the first stage;
- a second AD conversion circuit which converts an input analog signal of a second stage subsequent to the first stage into a digital value of a predetermined number of bits;
- a second DA conversion circuit which converts the output of the second AD conversion circuit into an analog signal;
- a second subtractor circuit which subtracts the output signal of the second DA conversion circuit from the input analog signal of the first stage;
- a common amplifier circuit which selectively amplifies the output signal of the first subtractor circuit or the output signal of the second subtractor circuit with a predetermined amplification factor;
- a first stage switch which turns on or off the delivery of the output signal of the first subtractor circuit to the common amplifier circuit; and
- a second stage switch which turns on or off the delivery of the output signal of the second subtractor circuit to the common amplifier circuit.

30. The analog-to-digital converter according to claim 29, further comprising an amplification control circuit which variably controls the amplification factor of the common amplifier circuit.

31. The analog-to-digital converter according to claim 29, wherein
any one of the two or more stages subtracts between a signal obtained by amplifying the input analog signal of the self-stage with a predetermined amplification factor and a signal, amplified with substantially the same amplification factor as the predetermined amplification factor, obtained by converting a converted digital value of the self-stage into an analog value.

* * * * *